(12) United States Patent
Tanaka et al.

(10) Patent No.: US 8,723,845 B2
(45) Date of Patent: May 13, 2014

(54) DISPLAY DEVICE

(75) Inventors: Shinya Tanaka, Osaka (JP); Tetsuo Kikuchi, Osaka (JP); Junya Shimada, Osaka (JP); Masahiro Yoshida, Osaka (JP); Isao Ogasawara, Osaka (JP); Satoshi Horiuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 138 days.

(21) Appl. No.: 13/574,049

(22) PCT Filed: Nov. 26, 2010

(86) PCT No.: PCT/JP2010/071162
§ 371 (c)(1),
(2), (4) Date: Jul. 19, 2012

(87) PCT Pub. No.: WO2011/096125
PCT Pub. Date: Aug. 11, 2011

(65) Prior Publication Data
US 2012/0299887 A1 Nov. 29, 2012

(30) Foreign Application Priority Data
Feb. 8, 2010 (JP) ................................. 2010-025220

(51) Int. Cl.
*G06F 3/038* (2013.01)
(52) U.S. Cl.
USPC ........................................................ 345/204
(58) Field of Classification Search
None
See application file for complete search history.

(56) References Cited

U.S. PATENT DOCUMENTS

| 5,555,001 A | 9/1996 | Lee et al. |
| 5,619,223 A | 4/1997 | Lee et al. |
| 6,639,634 B1 | 10/2003 | Zhang et al. |
| 2006/0049404 A1 | 3/2006 | Park et al. |
| 2007/0139429 A1* | 6/2007 | Vion-Dury ..................... 345/581 |
| 2010/0283931 A1 | 11/2010 | Horiuchi et al. |
| 2011/0001736 A1 | 1/2011 | Tanaka et al. |
| 2011/0007049 A1 | 1/2011 | Kikuchi et al. |
| 2011/0012880 A1 | 1/2011 | Tanaka et al. |
| 2011/0018846 A1* | 1/2011 | Hu et al. ....................... 345/204 |

FOREIGN PATENT DOCUMENTS

| JP | 01-225996 A | 9/1989 |
| JP | 11-295679 A | 10/1999 |
| JP | 2000-275669 A | 10/2000 |
| JP | 2005-31135 A | 2/2005 |
| WO | 2009/104302 A1 | 8/2009 |
| WO | 2009/128179 A1 | 10/2009 |
| WO | 2009/150862 A1 | 12/2009 |
| WO | 2009/150864 A1 | 12/2009 |

OTHER PUBLICATIONS

Official Communication issued in International Patent Application No. PCT/JP2010/071162, mailed on Dec. 21, 2010.

* cited by examiner

*Primary Examiner* — Adam R Giesy
(74) *Attorney, Agent, or Firm* — Keating & Bennett, LLP

(57) ABSTRACT

A signal distribution circuit (3) includes (i) a redundancy TFT element (8) provided so as to have a channel width identical to those of driving TFT elements (7), (ii) first redundancy lines (9a, 9b), (iii) a second redundancy line (10), and (iv) a third redundancy line (11). It is therefore possible to provide a liquid crystal display device including the signal distribution circuit (3) in which, even in a case where a leaking part (a defect part) is generated in any of the driving TFT elements (7), it does not take long to restore the leaking part, and productivity can be improved, the driving TFT elements (7) keeping respective channel widths identical to one another even after the leaking part is restored.

12 Claims, 13 Drawing Sheets

DISPLAY DEVICE

TECHNICAL FIELD

The present invention relates to a display device employing a driving circuit including TFTs each having a channel width wider than that of a conventional TFT, the TFTs being monolithically formed in a display panel.

BACKGROUND ART

Conventionally, in order to, for example, improve reliability, narrow a picture frame region, and reduce a manufacturing cost in the field of display devices, particularly, liquid crystal display devices, pixel TFTs provided in a display region of a liquid crystal display device are provided monolithically with driving TFTs provided in a scanning signal line driving circuit and a data signal line driving circuit that are provided in a peripheral region of the display region, by use of a semiconductor film, such as p-Si (polycrystalline silicon), CG-Si (continuous grain silicon) or microcrystalline silicon (μc-Si), which has a relatively high mobility.

Recently, in order to reduce the manufacturing cost, the pixel TFTs are provided monolithically with the driving TFTs provided in the scanning signal line driving circuit, by use of an a-Si (Amorphous Silicon) semiconductor film that can be formed at a lower cost without any crystallization process, though the a-Si semiconductor film has a mobility lower than that of the semiconductor film made from p-Si, CG-Si or microcrystalline silicon. In other words, monolithically forming a scanning signal line driving circuit by use of an a-Si semiconductor film (monolithically forming a gate driver) has been proposed.

The number of data signal lines is increased as a liquid crystal display device becomes high-resolution. Therefore, a data signal line driving circuit frequently includes data signal line driving circuits 116a, 116b and 116c (see FIG. 18).

FIG. 18 illustrates a configuration of a conventional liquid crystal display device 141 including the data signal line driving circuits 116a, 116b and 116c.

The liquid crystal display device 141 includes a display panel 112, a flexible print substrate 113, and a control substrate 114.

In the display panel 112 of the liquid crystal display device 141, pixel TFTs 121 provided for respective pixels in a display region 112a, and driving TFTs provided in a scanning signal line driving circuit 115 are incorporated by use of amorphous silicon formed on a glass substrate.

A plurality of pixels PIX are arranged in a matrix manner in the display region 112a. A pixel PIX includes a pixel TFT 121, a liquid crystal capacitor CL, and a storage capacitor Cs.

The pixel TFT 121 has a gate electrode connected to a corresponding one of scanning signal lines GL, a source electrode connected to a corresponding one of data signal lines SL, and a drain electrode connected to the liquid crystal capacitor CL and the storage capacitor Cs.

The scanning signal lines GL are made up of scanning signal lines GL1, GL2, GL3, . . . , and GLn. The scanning signal lines GL are connected to respective output terminals of the scanning signal line driving circuit 115. The data signal lines SL are made up of data signal lines SL1, SL2, SL3, . . . , and SLm. The data signal lines SL each are connected to a corresponding output terminal of the data signal line driving circuit 116a, 116b or 116c.

The storage capacitors Cs provided for the respective pixels PIX each have an electrode connected to a storage capacitor line (not shown) via which a storage capacitor voltage is applied to the electrode.

The scanning signal line driving circuit 115 is provided on a side of the display region 112a of the display panel 112, to which side the scanning signal lines GL1, GL2, GL3, . . . , and GLn extend (see FIG. 18). The scanning signal line driving circuit 115 sequentially supplies a scanning pulse (a gate pulse) to the scanning signal lines GL1, GL2, GL3, . . . , and GLn.

The scanning signal line driving circuit 115 can be provided monolithically with the display region 112a in the display panel 112 by use of a p-Si film, a CG-Si film, a microcrystalline silicon film, or an amorphous silicon film.

The data signal line driving circuits 116a, 116b and 116c are provided on the flexible print substrate 113, and supply data signals to the data signal lines SL1, SL2, SL3, . . . , and SLm.

The control substrate 114 is connected to the flexible print substrate 113, and supplies necessary signals and voltages to the scanning signal line driving circuit 115 and the data signal line driving circuits 116a, 116b and 116c. That is, the control substrate 114 supplies the necessary signals and voltages to the scanning signal line driving circuit 115 of the display panel 112 via the flexible print substrate 113.

In a case where the data signal line driving circuits 116a, 116b and 116c constitute a data signal line driving circuit as illustrated in the liquid crystal display device 141 of FIG. 18, a manufacturing cost and a mountable surface area will be increased.

In order to solve such a problem, there has been proposed a liquid crystal display device for carrying out an SSD (Source Shared Driving) method in which (i) the number of outputs from a data signal line driving circuit is decreased, and (ii) data signal lines provided for respective R, G and B are driven in a time division manner.

FIG. 19 exemplifies a liquid crystal display device 151 for performing an SSD method.

Note that a configuration of each of pixels PIX arranged in a matrix manner (see FIG. 19) is identical to that of the pixels PIX illustrated in FIG. 18, and therefore description of the configuration is omitted here.

The liquid crystal display device 151 includes a display panel 112, and a flexible print substrate 113. The display panel 112 includes the pixels PIX, a scanning signal line driving circuit (a gate driver) 153, and an SSD circuit 155. A data signal line driving circuit (a source driver) 152 having a chip shape is mounted on the flexible print substrate 113 (see FIG. 19).

A plurality of sets of three data signal lines are provided adjacent to each other in the display region 112, each of which sets includes a data signal line RSL connected to an R (red) pixel PIX, a data signal line GSL connected to a G (green) pixel PIX, and a data signal line BSL connected to a B (blue) pixel PIX.

FIG. 19 illustrates (i) the (n−1)-th set of data signal lines SLn−1 (RSLn−1, GSLn−1, and BSLn−1), (ii) the n-th set of data signal lines SLn (RSLn, GSLn, and BSLn), and (iii) (n+1)-th set of data signal lines SLn+1 (RSLn+1, GSLn+1, and BSLn+1).

The SSD circuit 155 includes (i) transistors (TFT) ASWR (ASWRn−1, ASWRn, and ASWRn+1 illustrated in FIG. 19) connected to edges of the respective data signal lines RSL, to each of which edges a data signal is to be supplied, (ii) transistors ASWG (ASWGn−1, ASWGn, and ASWGn+1 illustrated in FIG. 19) connected to edges of the respective data signal lines GSL, to each of which edges a data signal is to be supplied, and (iii) transistors ASWB (ASWBn−1, ASWBn, and ASWBn+1 illustrated in FIG. 19) connected to edges of the respective data signal lines BSL, to each of which edges a data signal is to be supplied.

For example, the transistors ASWRn, ASWGn, and ASWBn, having edges connected to the respective data signals lines RSLn, GSLn and BSLn belonging to an identical set, have respective other edges connected to one another. The other edges are connected to a corresponding output line DATA (DATAn illustrated in FIG. 19) of the data signal line driving circuit 152 (see FIG. 19).

In the liquid crystal display device 151 including such an SSD circuit 155, the number of output lines DATA in the data signal line driving circuit 152 can be reduced to one-third of the total number of output lines DATA in the data signal line driving circuits 116a, 116b and 116c provided in the liquid crystal display device 141 illustrated in FIG. 18, each of which data signal line driving circuits 116a, 116b and 116c is made up of chips. Further, the number of data signal line driving circuits provided in the liquid crystal display device 151 can be reduced to one-third of the number of the data signal line driving circuits provided in the liquid crystal display device 141. It is therefore possible to prevent increase in manufacturing cost and mountable surface area.

The following description will discuss in detail a configuration of the SSD circuit 155 with reference to FIG. 19.

The transistors ASWR, ASWG, and ASWB are sequentially turned on in a time division manner during substantially one-third of one horizontal period when respective ON signals Ron, Gon and Bon are inputted to gate electrodes of the respective transistors ASWR, ASWG, and ASWB. The transistor ASWR is turned on in response to an ON signal Ron of High level. This causes output DATA for a corresponding R pixel PIX to be supplied from the data signal line driving circuit 152 to a corresponding data signal line RSL. The transistor ASWG is turned on in response to an ON signal Gon of High level. This causes output DATA for a corresponding G pixel PIX to be supplied from the data signal line driving circuit 152 to a corresponding data signal line GSL. The transistor ASWB is turned on in response to an ON signal Bon of High level. This causes output DATA for a corresponding B pixel PIX to be supplied from the data signal line driving circuit 152 to a corresponding data signal line BSL.

That is, the transistors ASWR, ASWG, and ASWB have respective source electrodes and respective drain electrodes, ones of the source electrodes and the drain electrodes being connected to the respective data signal lines RSL, GSL, and BSL, and the other ones of the source electrodes and the drain electrodes being connected to a corresponding output line DATA of the data signal line driving circuit 152 (see FIG. 19).

The scanning signal line driving circuit 153 and the SSD circuit 155 can be incorporated in the display panel 112 monolithically with pixel TFTs 121 provided in a display region of the display panel 112, by use of a p-Si film, a CG-Si film, a microcrystalline silicon film, an oxide semiconductor film, or an amorphous silicon film.

Meanwhile, a TFT having a channel width wider than that of a conventional TFT should be employed in a case where driving TFTs do not meet a predetermined mobility required for circuit driving, particularly in a case where the driving TFTs are formed by use of an amorphous silicon film, which driving TFTs are provided in each of a scanning signal line driving circuit, a data signal line driving circuit and an SSD circuit that can be thus incorporated monolithically with pixel TFTs provided in a display region of a liquid crystal display device, by use of a p-Si film, a CG-Si film, a microcrystalline silicon film, an oxide semiconductor film, or an amorphous silicon film.

FIG. 20 is a view exemplifying a TFT having a wide channel width.

(a) of FIG. 20 is a view illustrating a part of a TFT, with a wide channel width, which includes a consecutive U-shape (comb teeth shape) electrode.

(a) of FIG. 20 illustrates a partial region 200 of a plurality of partial regions 200 included in the TFT. The partial region 200 includes a gate electrode line 210, a source electrode line 230, and a drain electrode line 240. The source electrode line 230 has an U-shape part surrounding an I-shape part of the drain electrode line 240. A channel is formed between the U-shape part and the I-shape part.

The TFT includes the plurality of partial regions 200 connected in juxtaposition with one another (not shown in (a) of FIG. 20).

The channel has (i) a width represented by a distance W of 2×DL1+DL2 and (ii) a length represented by a distance L between a first boundary and a second boundary (see (a) of FIG. 20). The first boundary is between the source electrode line 230 and a channel region. The second boundary is between the drain electrode line 240 and the channel region.

The TFT thus includes the plurality of partial regions 200 connected in juxtaposition with one another. It is therefore possible to provide a TFT having a remarkably wide channel width.

There is, however, a problem that an abnormality occurs in a property of the whole TFT configured as illustrated in (a) of FIG. 20 when even just a leak is generated between the source electrode line 230 and the drain electrode line 240.

Therefore, in a case where a short cut is caused between the U-shape part of the source electrode line 230 and the I-shape part of the drain electrode line 240 by, for example, a defect during a process, an upper part of the I-shape part of the drain electrode line 240 is melted and separated by use of laser, so that the whole TFT can normally operate.

In a case, however, where the I-shape part of the drain electrode line 240 is melted and separated by use of laser, the laser reaches a layer in which a semiconductor layer and an n$^+$ layer are stacked, which layer is formed in an upper region of the gate electrode line 210. This is because a distance between a main body of the drain electrode line 240 and the upper region of the gate electrode line 210 is short in the TFT configured as illustrated in (a) of FIG. 20.

The layer, damaged by the laser, further transmits heat generated by the laser to a region adjacent to the layer because the layer extends to the whole TFT. This causes damage over a broad area including the region adjacent to the layer.

CITATION LIST

Patent Literature

Patent Literature 1

International Publication No. WO 2009/104302 (Publication Date: Aug. 27, 2009)

SUMMARY OF INVENTION

Technical Problem

In order to solve the problem, it has been considered employing a TFT configured as illustrated in (b) of FIG. 20, which TFT is described in Patent Literature 1.

A TFT 300 includes a gate electrode 302, a first source/drain electrode 303, and a second source/drain electrode 304.

The first source/drain electrode 303 serves as a source electrode when the second source/drain electrode 304 serves as a drain electrode, and vice versa.

The gate electrode 302 has a U-shape, and is provided, on a glass substrate, below where the first source/drain electrode 303 and the second source/drain electrode 304 are formed.

Above the gate electrode 302, a layer in which a semiconductor layer and an $n^+$ layer are stacked is provided via a gate insulating film. In a case where a first region R, which is hatched, represents a region where the semiconductor layer is provided, a region of the layer exists in the first region R, and the first source/drain electrode 303 is provided on the $n^+$ layer in the first region R. Note that a region 305 other than the first source/drain electrode 303 in the first region R is a region of the semiconductor layer, in which region no $n^+$ layer is provided above.

The second source/drain electrode 304 includes an electrode line 304a and a plurality of branch electrodes 304b.

The electrode line 304a is a linear electrode provided in a center gap region of the gate electrode 302 having the U-shape. The plurality of branch electrodes 304b are a group of electrodes extending from the electrode line 304a to both sides of the first source/drain electrode 303. Each of the plurality of branch electrodes 304b extends to the $n^+$ layer in the first region R. The source/drain electrode 303 is provided so as to surround the plurality of branch electrodes 304b via a predetermined distance.

The first source/drain electrode 303 sandwiches, with the plurality of branch electrodes 304b present in the first region R, a pattern of the semiconductor layer of the layer, in which pattern includes no $n^+$ layer. The pattern extends to a panel in-plane direction. The pattern of the semiconductor layer is a channel forming region 305a in the TFT 300.

In a part D where the plurality of branch electrodes 304b of the second source/drain electrode 304 intersect with the first region R hatched in (b) of FIG. 20, an outer periphery of the first region R is located on a line f which is closer to the electrode line 304a than a boundary line e inside the gate electrode 302 having the U-shape. There are regions 306 where the layer in which the semiconductor layer and the $n^+$ layer are stacked extends from the boundary line e to the line f.

Between any adjacent regions 306, the outer periphery of the first region R is located on a line g that is more distant from the electrode line 304a than the boundary line e.

A distance d1 between the part D and the electrode line 304a is set to be not less than 5 μm.

Such a setting makes it possible to easily irradiate with laser a point Q on one of the plurality of branch electrodes 304b of the second source/drain electrode 304 without irradiating the part D and the electrode line 304a with the laser, in a case where a leak is generated between the first source/drain electrode 303 and the branch electrode 304b, specifically in a case where, for example, a short cut is caused in a part S illustrated in (b) of FIG. 20.

Patent Literature 1 thus describes that according to the configuration, it is possible to provide a TFT, with a wide channel width, which can easily restore a leak generated between a source electrode and a drain electrode.

The above-configured TFT, however, has a problem that reduction in productivity occurs because it takes long to (i) find out a leaking part (a defect part) in the TFT and (ii) separate the leaking part by use of laser, due to the fact that the TFT has such a wide channel width (see (b) of FIG. 20).

Further, according to the configuration of the TFT, merely a leaking part (a defect part) is separated by use of laser. This causes a difference in channel width between (i) a first TFT whose leaking part has been separated by use of laser and (ii) a second TFT having no part separated by use of laser. As such, a display device, employing a driving circuit including such first and second TFTs, causes a problem of deterioration in display quality.

The present invention was made in view of the problem, and an object of the present invention is to provide a display device employing a driving circuit including TFTs in which, even in a case where a leaking part (a defect part) is generated, it does not take long to restore the leaking part (the defect part), and productivity can be improved, the TFTs keeping respective channel widths identical to one another even after the leaking part is restored.

Solution to Problem

In order to attain the object, a display device of the present invention is A display device, having: a display region where (i) pixels arranged in a matrix manner and (ii) pixel TFT elements provided for the respective pixels, are provided; and a region on the periphery of the display region, in which region a driving circuit, including driving TFT elements formed monolithically with the pixel TFT elements, is provided, each of the driving TFT elements including a semiconductor layer, a gate electrode, a source electrode, and a drain electrode, the gate electrode being provided on a first surface of the semiconductor layer, and the source electrode and the drain electrode being provided on a second surface of the semiconductor layer, the second surface facing the first surface, one of the source electrode and the drain electrode being provided, in a region, so as to surround part of the other of the source electrode and the drain electrode, the one of the source electrode and the drain electrode being away, in the region, from the other by a constant distance, the driving circuit further including (i) a redundancy TFT element provided so as to have a channel width identical to those of the driving TFT elements, (ii) a first redundancy line, (iii) a second redundancy line, and (iv) a third redundancy line, the first redundancy line being provided, by electrically connecting to one of a plurality of first lines for supplying different first signals to the gate electrodes of the respective driving TFT elements, so as to supply, to a gate electrode of the redundancy TFT element, a first signal that is to be supplied via the one of the plurality of first lines electrically connected to the first redundancy line, the second redundancy line being provided, by electrically connecting to one of a plurality of second lines for supplying different second signals to the source electrodes of the respective driving TFT elements, so as to supply, to a source electrode of the redundancy TFT element, a second signal that is to be supplied via the one of the plurality of second lines electrically connected to the second redundancy line, and the third redundancy line being electrically connected to a drain electrode of the redundancy TFT element, and the third redundancy line being provided, by electrically connecting to one of a plurality of third lines, via which the different second signals are outputted from the drain electrodes of the respective driving TFT elements, so that a corresponding one of the different second signals, which is to be outputted from the drain electrode of the redundancy TFT element, is outputted from the one of the plurality of third lines electrically connected to the third redundancy line.

According to the configuration, the one of the source electrode and the drain electrode of each of the driving TFT element and the redundancy TFT element is provided, in a region, so as to surround part of the other of the source electrode and the drain electrode, and the one of the source electrode and the drain electrode is away, in the region, from the other by a constant distance. That is, a driving TFT element, with a wide channel width, which includes a U-shape electrode or a comb teeth shape electrode, is employed.

Conventionally, in a case where a leaking part (a defect part) is generated between the source electrode and the drain electrode in the driving TFT element having such a wide channel width, the leaking part is separated by use of laser so that the driving TFT element is restored. In contrast, according to the configuration, restoration is carried out by use of the redundancy TFT element, the first redundancy line, the second redundancy line, and the third redundancy line, all of which are provided separately from the driving TFT element.

The configuration eliminates a conventional problem that a reduction in productivity occurs because it takes long to (i) find out a leaking part (a defect part) in the driving TFT element and (ii) separate the leaking part by use of laser, due to the fact that the driving TFT element has a wide channel width.

Further, conventionally, merely a leaking part (a defect part) of the driving TFT element having a wide channel width is separated by use of laser. This causes a difference in channel width between (i) a first driving TFT element whose leaking part has been separated by use of laser and (ii) a second driving TFT element having no part separated by use of laser. As such, a display device, employing a driving circuit including such first and second driving TFT elements, causes a problem of deterioration in display quality.

In contrast, according to the configuration, it is possible to provide a display device capable of preventing deterioration in display quality. This is because restoration is carried out by use of (i) the redundancy TFT element provided so as to have a channel width identical to that of the driving TFT element, (ii) the first redundancy lines, (iii) the second redundancy line, and (iv) the third redundancy line, instead of using the driving TFT element in which a leaking part (a defect part) is generated.

Advantageous Effects of Invention

A display device of the present invention is configured such that each of the driving TFT elements includes a semiconductor layer, a gate electrode, a source electrode, and a drain electrode, the gate electrode is provided on a first surface of the semiconductor layer, and the source electrode and the drain electrode is provided on a second surface of the semiconductor layer, the second surface facing the first surface, one of the source electrode and the drain electrode is provided, in a region, so as to surround part of the other of the source electrode and the drain electrode, the one of the source electrode and the drain electrode is away, in the region, from the other by a constant distance, the driving circuit further includes (i) a redundancy TFT element provided so as to have a channel width identical to those of the driving TFT elements, (ii) a first redundancy line, (iii) a second redundancy line, and (iv) a third redundancy line, the first redundancy line is provided, by electrically connecting to one of a plurality of first lines for supplying different first signals to the gate electrodes of the respective driving TFT elements, so as to supply, to a gate electrode of the redundancy TFT element, a first signal that is to be supplied via the one of the plurality of first lines electrically connected to the first redundancy line, the second redundancy line is provided, by electrically connecting to one of a plurality of second lines for supplying different second signals to the source electrodes of the respective driving TFT elements, so as to supply, to a source electrode of the redundancy TFT element, a second signal that is to be supplied via the one of the plurality of second lines electrically connected to the second redundancy line, and the third redundancy line is electrically connected to a drain electrode of the redundancy TFT element, and the third redundancy line is provided, by electrically connecting to one of a plurality of third lines, via which the different second signals are outputted from the drain electrodes of the respective driving TFT elements, so that a corresponding one of the different second signals, which is to be outputted from the drain electrode of the redundancy TFT element, is outputted from the one of the plurality of third lines electrically connected to the third redundancy line.

It is therefore possible to provide a display device employing a driving circuit including TFTs in which, even in a case where a leaking part (a defect part) is generated, it does not take long to restore the leaking part (the defect part), and productivity can be improved, the TFTs keeping respective channel widths identical to one another even after the leaking part is restored.

DESCRIPTION OF EMBODIMENTS

The following description will discuss in detail Embodiments of the present invention, with reference to drawings. Note, however, that a dimension, a material, a shape, and a relative arrangement of components described in the Embodiments are illustrative only, and therefore the scope of the present invention should not be narrowly interpreted within the limits of such Embodiments.

[Embodiment 1]

The following description will discuss, as a display device of the present invention which display device employs a driving circuit including driving TFT elements each of which has a wide channel width, a liquid crystal display device employing a signal distribution circuit (an SSD circuit) including driving TFT elements each having a wide channel width, with reference to FIGS. 1 through 10. Note, however, that the driving circuit is not limited to the signal distribution circuit, provided that it employs driving TFT elements each having a wide channel width. For example, a scanning signal line driving circuit or a data signal line driving circuit can be employed as the driving circuit.

The liquid crystal display device is exemplified as a display device in Embodiment 1. Note, however, that the display device is not limited to the liquid crystal display device. For example, an EL display device can be employed as the display device.

Figure 2:
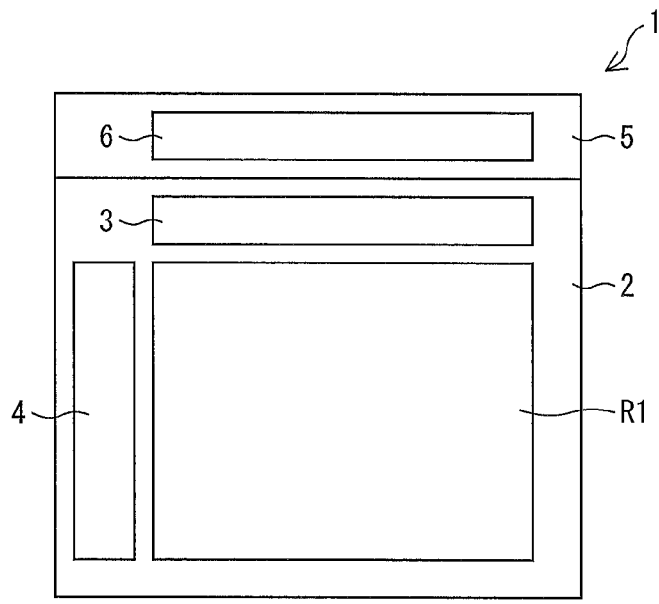
FIG. 2 is a view schematically illustrating a configuration of a liquid crystal display device in accordance with an embodiment of the present invention.

FIG. 2 is a view schematically illustrating a configuration of a liquid crystal display device 1 of Embodiment 1.

The liquid crystal display device 1 includes (i) a liquid crystal display panel 2 and (ii) a data signal line driving circuit 6 mounted on a flexible print substrate 5 (see FIG. 2). The liquid crystal display panel 2 includes (a) a display region R1, (b) a signal distribution circuit 3, and (c) a scanning signal line driving circuit 4.

In the display region R1, there are provided (i) pixels arranged in a matrix manner, (ii) pixel TFT elements provided for the respective pixels, (iii) scanning signal lines each connected to gate electrodes of corresponding pixel TFT elements, and (iv) data signal lines each connected to source electrodes of corresponding pixel TFT elements (all not shown).

The signal distribution circuit 3 and the scanning signal line driving circuit 4 are provided monolithically with the pixel TFT elements in a peripheral region of the display region R1.

According to Embodiment 1, in order to prevent rise in unit cost for manufacturing the liquid crystal display device 1, semiconductor layers of (i) driving TFT elements provided in each of the signal distribution circuit 3 and the scanning signal line driving circuit 4 and (ii) the pixel TFT elements are made from amorphous silicon. Note, however, that Embodiment 1 is not limited to this. Examples of the semiconductor layers encompass an oxide layer, a microcrystalline silicon layer, a layer in which a microcrystalline silicon and an amorphous silicon are stacked, a polycrystalline silicon layer, and a continuous grain boundary crystal silicon layer.

Examples of the semiconductor layers also encompass amorphous germanium, polycrystalline germanium, amorphous silicon germanium, polycrystalline silicon germanium, amorphous silicon carbide, and polycrystalline silicon carbide.

Note that the oxide layer can be made from, for example, an amorphous oxide containing at least one element selected from the group consisting of In, Ga and Zn. Note, however, that Embodiment 1 is not limited to this.

According to Embodiment 1, each of the semiconductor layers is made from amorphous silicon having a relatively low mobility. This causes the data signal line driving circuit 6 to be provided on the flexible print substrate 5 in a separate step. Meanwhile, in a case where a semiconductor layer having a relatively high mobility is employed, the data signal line driving circuit 6 can be also provided monolithically with the pixel TFT elements.

Figure 19:
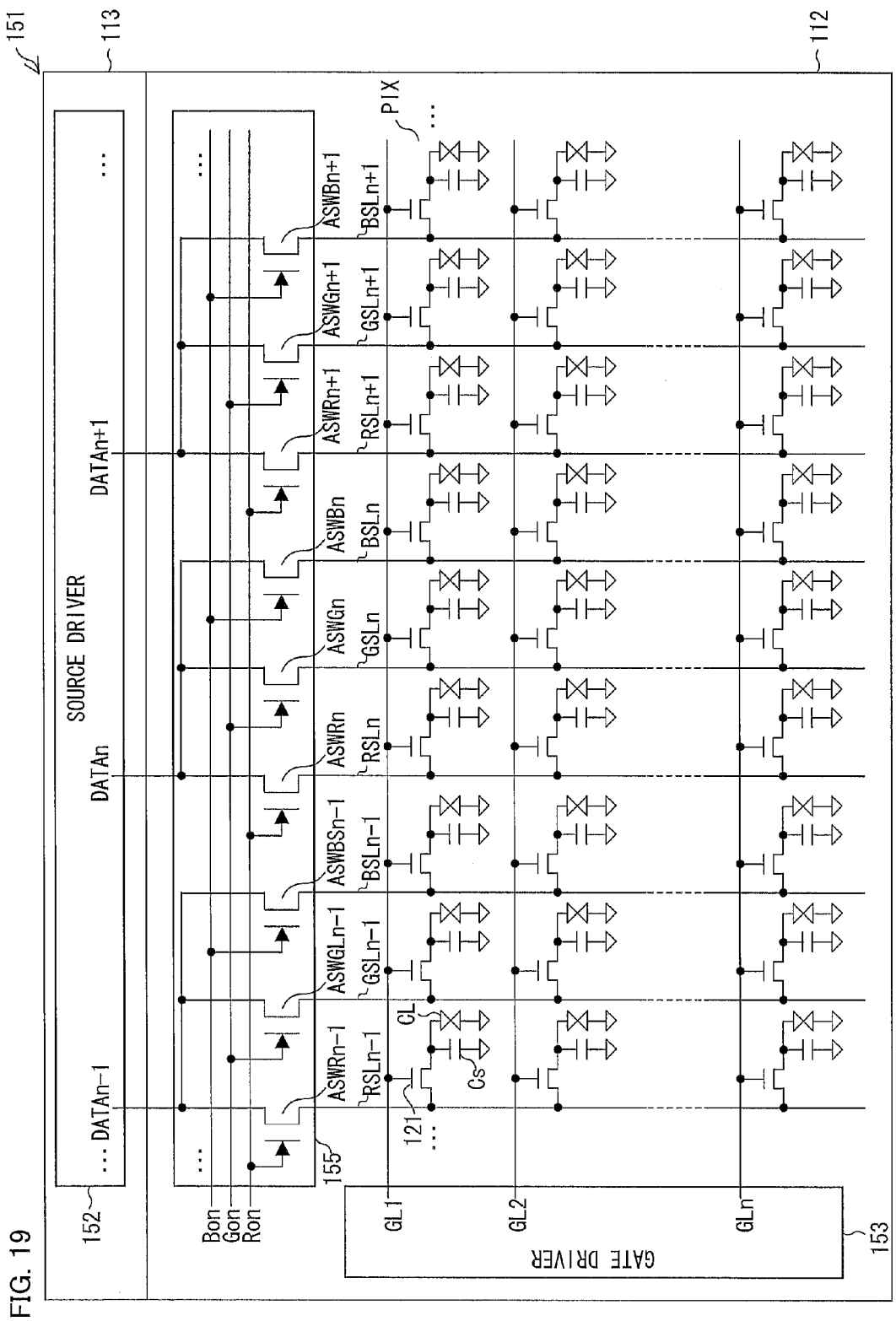
FIG. 19 exemplifies a liquid crystal display device for carrying out an SSD method.

Note that the signal distribution circuit 3 provided in the liquid crystal display device 1 is identical to an SSD circuit 155 provided in a conventional liquid crystal display device 151 illustrated in FIG. 19, except that the signal distribution circuit 3 includes a redundancy TFT element, a first redundancy line, a second redundancy line, a third redundancy line, and a fourth redundancy line.

Figure 1:
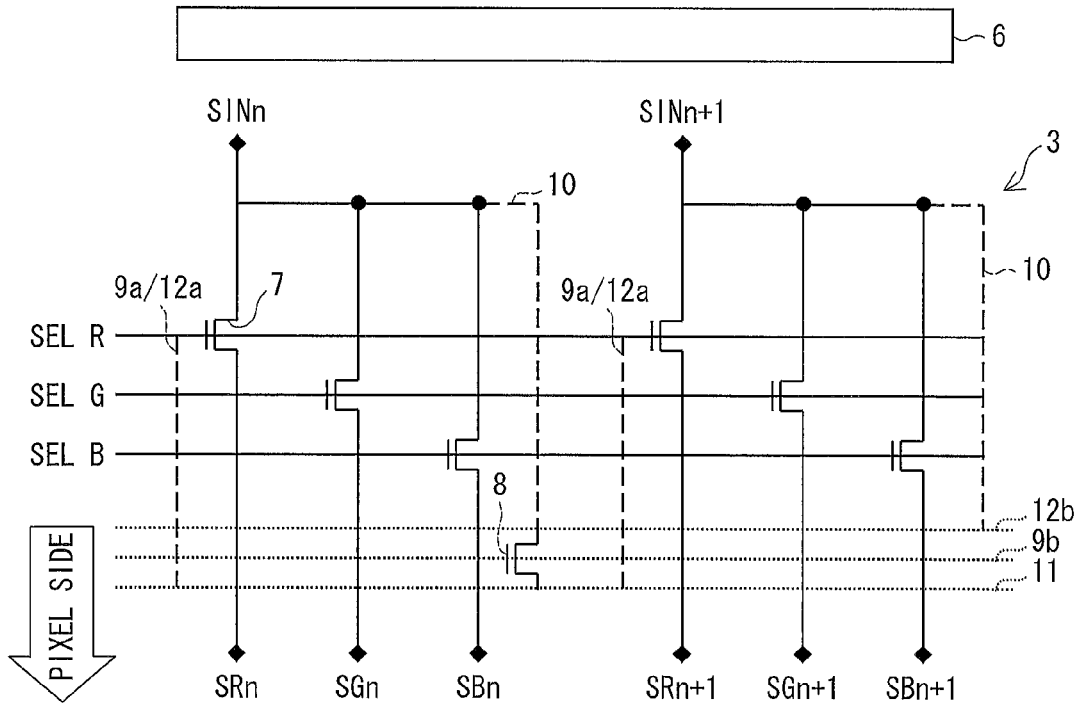
FIG. 1 is a view schematically illustrating a part of a signal distribution circuit provided in a liquid crystal display device in accordance with an embodiment of the present invention.

FIG. 1 is a view schematically illustrating a part of the signal distribution circuit 3 provided in the liquid crystal display device 1 of Embodiment 1.

A plurality of sets of data signal lines are provided adjacent to one another. Each of the plurality of sets of data signal lines includes (i) a data signal line SRn connected to an R (red) pixel PIX, (ii) a data signal line SGn connected to a G (green) pixel PIX, and (iii) a data signal line SBn connected to a B (blue) pixel PIX (see FIG. 1).

FIG. 1 merely illustrates (i) the n-th set of data signal lines SRn, SGn and SBn and (ii) the (n+1)-th set of data signal lines SRn+1, SGn+1 and SBn+1.

In the signal distribution circuit 3, the data signal lines SRn, SGn, SBn, . . . have edges connected to respective driving TFT elements 7, via which edges respective data signals are to be supplied.

Figure 20:
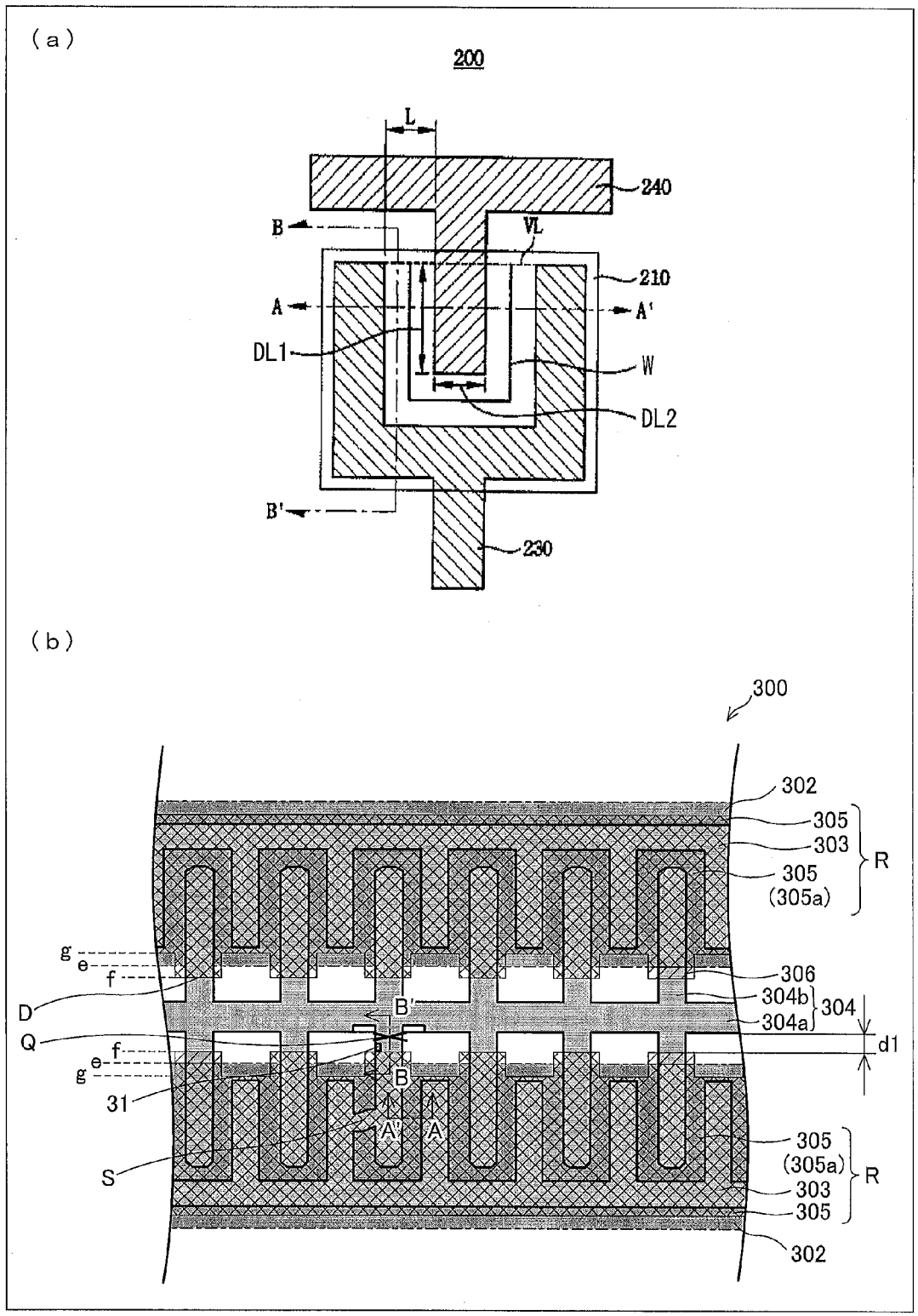
FIG. 20 is a view exemplifying a TFT having a wide channel width.

The driving TFT elements 7 each have a semiconductor layer made from amorphous silicon having a low mobility. Therefore, one of a source electrode and a drain electrode of the driving TFT element 7 is provided, in a region, so as to surround part of the other of the source electrode and the drain electrode of the driving TFT element 7, and the one of the source electrode and the drain electrode of the driving TFT element 7 is away, in the region, from the other by a constant distance. This causes the driving TFT element 7 to have a wide channel width (see FIG. 20). The driving TFT element 7 thus includes a U-shape electrode or a comb teeth shape electrode.

The data signal lines SRn, SGn and SBn belonging to an identical set are connected to one another on a side of the driving TFT elements 7, and are connected to an output terminal SINn of the data signal line driving circuit 6. The data signal lines SRn+1, SGn+1 and SBn+1 belonging to another identical set are connected to another output terminal SINn+1 of the data signal line driving circuit 6 (see FIG. 1).

The driving TFT elements 7 have gate electrodes to which control signals (first signals) are supplied, via respective of a first control signal line SEL R, a second control signal line SEL G, and a third control signal line SEL B. The driving TFT elements 7, connected to the respective data signal lines SRn, SGn and SBn belonging to the identical set, are sequentially turned on, in a time division manner, for approximately one-third of one horizontal period.

The driving TFT elements 7 connected to the respective data signal lines SRn, SRn+1, . . . are turned on while a control signal of High level is being supplied to the first control signal line SEL R. This causes pieces of output DATA (second signals, image signals) for respective R pixels PIX to be supplied from the output terminals SINn, SINn+1, . . . of the data signal line driving circuit 6 to the respective data signal lines SRn, SRn+1, . . . .

The driving TFT elements 7 connected to the respective data signal lines SGn, SGn+1, . . . are turned on while a control signal of High level is being supplied to the second control signal line SEL G. This causes pieces of output DATA for respective G pixels PIX to be supplied from the output terminals SINn, SINn+1, . . . of the data signal line driving circuit 6 to the respective data signal lines SGn, SGn+1, . . . .

The driving TFT elements 7 connected to the respective data signal lines SBn, SBn+1, . . . are turned on while a control signal of High level is being supplied to the third control signal line SEL B. This causes pieces of output DATA for respective B pixels PIX to be supplied from the output terminals SINn, SINn+1, . . . of the data signal line driving circuit 6 to the respective data signal lines SBn, SBn+1, . . . .

That is, each of the driving TFT elements 7 has (i) a drain electrode connected to a corresponding one of the data signal lines SRn, SGn, SBn . . . , and (ii) a source electrode connected to a corresponding one of the output terminals SINn, SINn+1 . . . of the data signal line driving circuit 6 (see FIG. 1).

The signal distribution circuit 3 includes, for each of the plurality of sets of data signal lines, (i) a redundancy TFT element 8 provided so as to have a channel width identical to those of the driving TFT elements 7, (ii) first redundancy lines 9a and 9b, (iii) a second redundancy line 10, (iv) a third redundancy line 11, and (v) fourth redundancy lines 12a and 12b (see FIG. 1).

Figure 3:
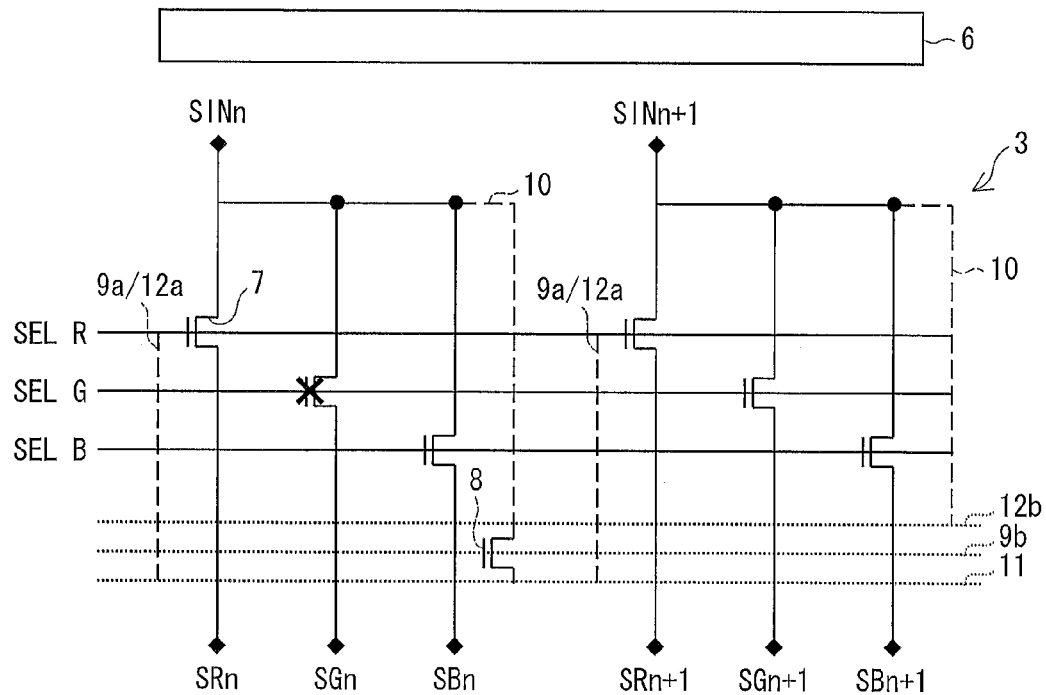
FIG. 3 is a view exemplifying a case where a leak (a defect) is generated in a driving TFT element of a signal distribution circuit provided in a liquid crystal display device in accordance with an embodiment of the present invention.

FIG. 3 exemplifies a case where a leak (defect) is generated in a driving TFT element 7 of the signal distribution circuit 3 provided in the liquid crystal display device 1 of Embodiment 1.

Specifically, FIG. 3 exemplifies a case where a leak (a defect) is generated in the driving TFT element 7 connected to the data signal line SGn.

Figure 4:
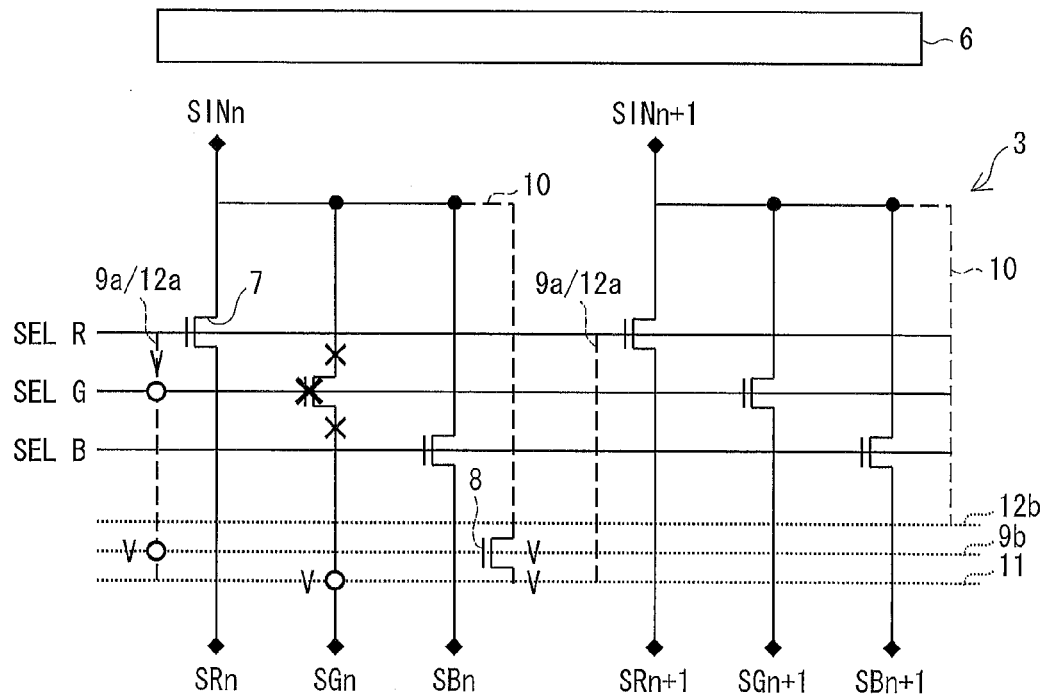
FIG. 4 is an explanatory view for describing a case where the signal distribution circuit illustrated in FIG. 3 is restored by use of a redundancy TFT element, a first redundancy line, a second redundancy line, and a third redundancy line.

FIG. 4 is an explanatory view for describing a case where the signal distribution circuit 3 illustrated in FIG. 3 is restored by use of a redundancy TFT element 8, first redundancy lines 9a and 9b, a second redundancy line 10, and a third redundancy line 11.

In FIG. 4, points indicated by circles represent respective parts to be electrically connected by use of laser, points Xs represent respective parts to be electrically disconnected by use of laser, and point Vs represent respective parts to be electrically disconnected by use of laser as appropriate in accordance with a peripheral load (resistor and/or capacitor).

In a case where a leak (a defect) is generated in the driving TFT element 7 connected to the data signal line SGn, the driving TFT element 7, connected to the data signal line SGn, is electrically disconnected at its both ends (the drain electrode and the source electrode) from the data signal line SGn, so as to be electrically isolated from the data signal line SGn (see FIG. 4).

The first redundancy line 9a is provided so as to intersect with the control signal lines SEL R, SEL G, and SEL B electrically connected to the gate electrodes of the respective driving TFT elements 7. The first redundancy line 9b is provided in parallel to the control signal lines SEL R, SEL G, and SEL B.

Thereafter, (i) an intersection of the first redundancy line 9a and the second control signal line SEL G and (ii) an intersection of the first redundancy lines 9a and 9b are electrically connected to each other (see FIG. 4). This allows a control signal, supplied via the control signal line SEL G, to be supplied to a gate electrode of the redundancy TFT element 8.

The second redundancy line 10 is connected to one of the output terminals SINn, SINn+1 . . . of the data signal line driving circuit 6 (see FIG. 4).

According to Embodiment 1, a single redundancy TFT element 8 is shared by the output terminals SINn and SINn+1 of the data signal line driving circuit 6 (that is, a single redundancy TFT element 8 is shared by two output terminals of the data signal line driving circuit 6). The second redundancy line 10 is connected in advance to the output terminals SINn and SINn+1 of the data signal line driving circuit 6. Note, however, that Embodiment 1 is not limited to this. The redundancy TFT elements 8 can be provided for the respective output terminals of the data signal line driving circuit 6. The second redundancy line 10 can be provided as later described in Embodiment 2.

The third redundancy line 11 is provided so as to intersect with the data signal lines SRn, SGn, SBn . . . , and is connected to each of a drain electrode of the redundancy TFT element 8 and the data signal line SGn.

Figure 5:
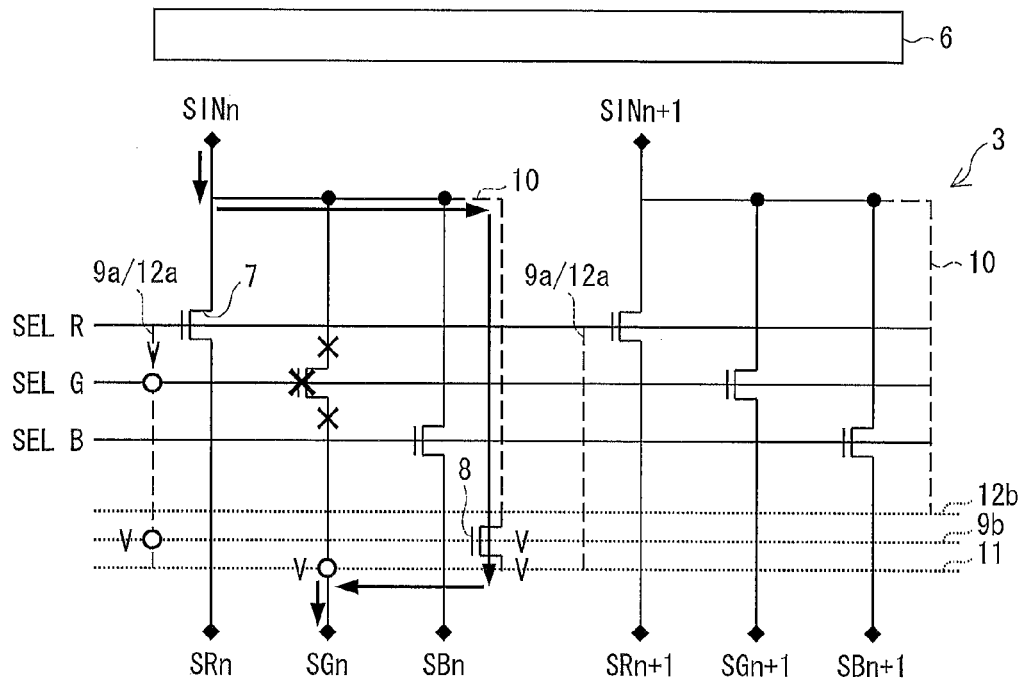
FIG. 5 is a view illustrating how output DATA, outputted from an output terminal of a data signal line driving circuit, flows after the signal distribution circuit is restored as illustrated in FIG. 4.

FIG. 5 is a view illustrating how output DATA, outputted from an output terminal of the data signal line driving circuit 6, flows after the signal distribution circuit 3 is restored as illustrated in FIG. 4.

According to the configuration, the output DATA outputted from the output terminal SINn of the data signal line driving circuit 6 can be supplied to the data signal line SGn, via the redundancy TFT element 8 instead of the driving TFT element 7 in which a leak (a defect) is generated (see FIG. 5).

According to the configuration, it is unnecessary to electrically disconnect a leaking part (a defect part) of the driving TFT element 7 by use of laser, unlike a conventional configuration. It is therefore possible to restore the signal distribution circuit 3 in which a leak is generated, by use of the redundancy TFT element 8, the first redundancy lines 9a and 9b, the second redundancy line 10, and the third redundancy line 11 all of which are provided in the signal distribution circuit 3.

This eliminates a conventional problem that a reduction in productivity occurs because it takes long to (i) find out a leaking part (a defect part) in a driving TFT element 7 and (ii) separate the leaking part by use of laser, due to the fact that the driving TFT element 7 has a wide channel width.

Furthermore, according to the conventional configuration, it is necessary to separate, by use of laser, merely a leaking part (a defect part) of a driving TFT element having a wide channel width. This causes a difference in channel width between (i) a first driving TFT element 7 whose leaking part has been separated by use of laser and (ii) a second driving TFT element 7 having no part separated by use of laser. As such, a liquid crystal display device, employing the signal distribution circuit 3 including such first and second driving TFT elements 7, causes a problem of deterioration in display quality.

In contrast, according to the configuration of Embodiment 1, it is possible to provide the liquid crystal display device 1 capable of preventing deterioration in display quality. This is because the restoration is carried out by use of (i) the redundancy TFT element 8 provided so as to have a channel width identical to those of the driving TFT elements 7, (ii) the first redundancy lines 9a and 9b, (iii) the second redundancy line 10, and (iv) the third redundancy line 11, instead of using the driving TFT element 7 in which a leaking part (a defect part) is generated.

Note that Embodiment 1 exemplifies the liquid crystal display device 1 in which a time-division driving is carried out in which the number of time divisions is three (R, G and B). Embodiment 1 is, however, not limited to this. It goes without saying that a time division driving can be carried out in which the number of time divisions is arbitrary number such as two or not less than four. It is possible to further reduce (i) the number of output terminals SINn, SINn+1 . . . of the data signal line driving circuit 6 and (ii) the number of the data signal line driving circuits 6, as the number of time divisions of the time division driving is increased.

Figure 6:
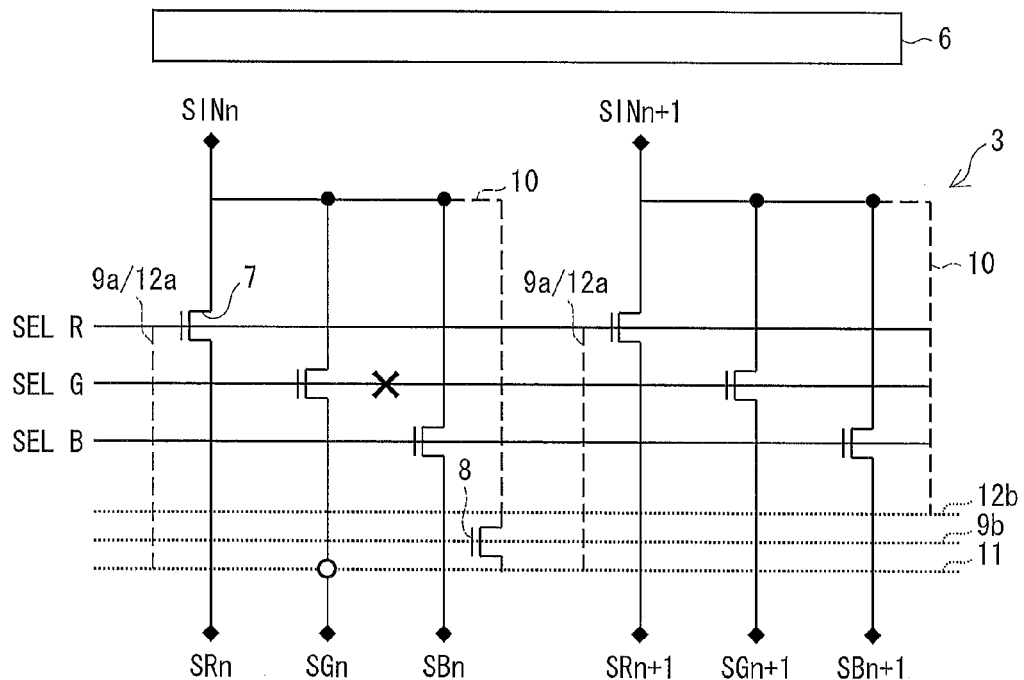
FIG. 6 is a view exemplifying a case where a control signal line SEL G is electrically disconnected in a signal distribution circuit provided in a liquid crystal display device in accordance with an embodiment of the present invention.
Figure 7:
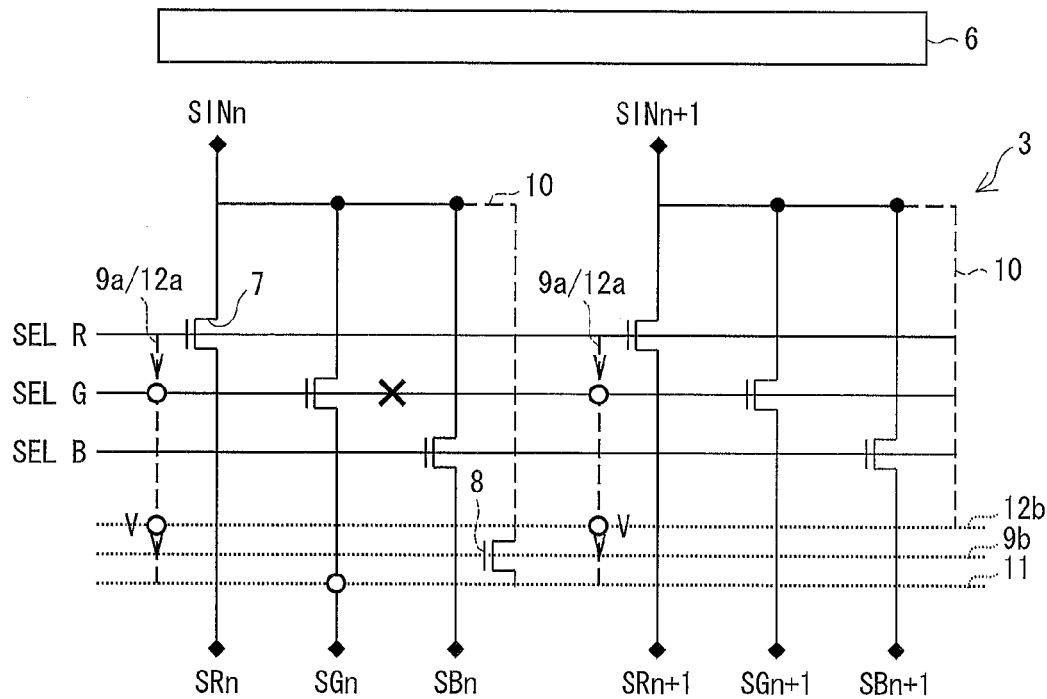
FIG. 7 is an explanatory view for describing a case where an electrical disconnection generated in the signal distribution circuit illustrated in FIG. 6 is restored by use of a fourth redundancy line.
Figure 8:
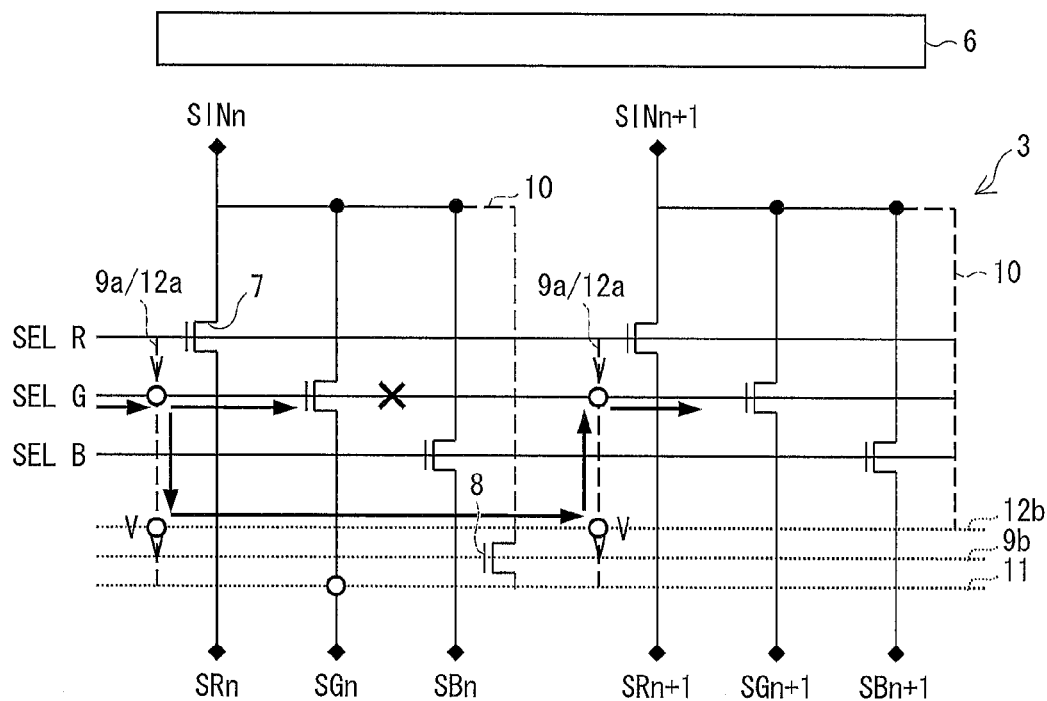
FIG. 8 is a view illustrating how a control signal, supplied via a control signal line SEL G, flows after the signal distribution circuit is restored as illustrated in FIG. 7.

The following description will discuss, with reference to FIGS. 6 through 8, how to restore, by use of the fourth redundancy lines 12a and 12b, an electrical disconnection which has occurred in any of the control signal lines SEL R, SEL G, and SEL B via which different control signals are supplied to gate electrodes of the respective driving TFT elements 7.

FIG. 6 is a view exemplifying a case where the control signal line SEL G is electrically disconnected in a signal distribution circuit 3 provided in a liquid crystal display device 1 of Embodiment 1.

FIG. 6 illustrates an electrical disconnection generated in the control signal line SEL G between first and second driving TFT elements 7 each of which is connected to the control signal line SEL G.

FIG. 7 is an explanatory view for describing a case where the electrical disconnection generated in the signal distribution circuit 3 illustrated in FIG. 6 is restored by use of the fourth redundancy lines 12a and 12b.

Note that, according to Embodiment 1, the first redundancy lines 9a can be used as the fourth redundancy lines 12a and vice versa so that an area in which the signal distribution circuit 3 is formed is reduced. Embodiment 1 is, however, not limited to this. The first redundancy lines 9a can be provided separately from the fourth redundancy lines 12a.

In FIG. 7, points indicated by circles represent respective parts to be electrically connected by use of laser, and points Vs represent respective parts to be electrically disconnected by use of laser as appropriate in accordance with a peripheral load (resistor and/or capacitor).

The fourth redundancy line 12b is provided so as to intersect with the two first redundancy lines 9a, and (i) an intersection of the control signal line SEL G and the two first redundancy lines 9a and (ii) an intersection of the fourth redundancy line 12b and the two first redundancy lines 9a are electrically connected to each other (see FIG. 7). This allows the electrical disconnection generated in the signal distribution circuit 3 illustrated in FIG. 6 to be restored.

FIG. 8 is a view illustrating how a control signal, supplied via the control signal line SEL G, flows after the signal distribution circuit 3 is restored as illustrated in FIG. 7.

According to the configuration, a control signal supplied to the first driving TFT element 7 is supplied to the second driving TFT element 7 connected to the control signal line SEL G, via the fourth redundancy lines 12a and the fourth redundancy line 12b, instead of using a part of the control signal line SEL G, in which part the electrical disconnection is generated (see FIG. 8).

Figure 9:
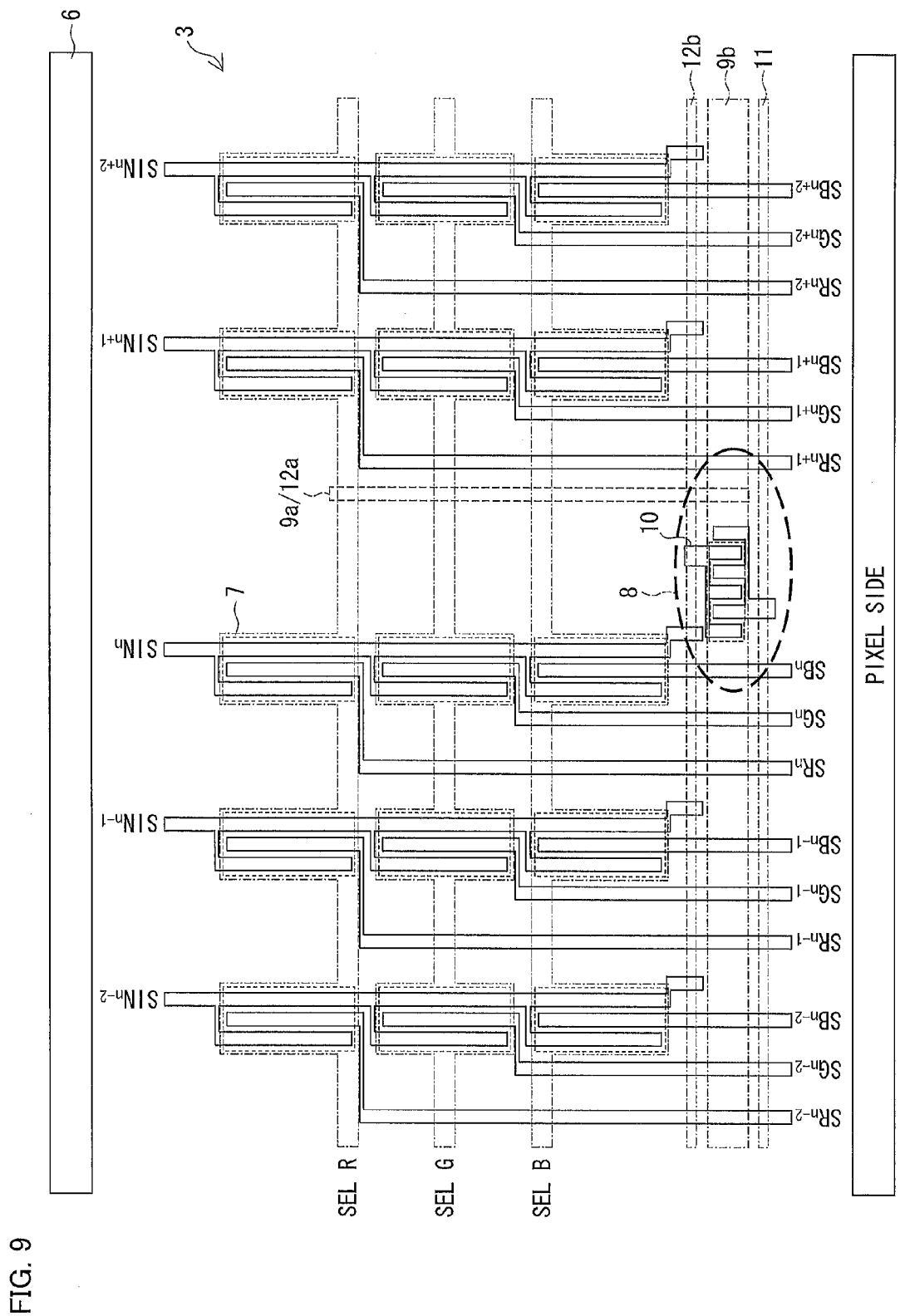
FIG. 9 is a view illustrating a layout of a signal distribution circuit provided in a liquid crystal display device in accordance with an embodiment of the present invention.

FIG. 9 is a view exemplifying a layout of a signal distribution circuit 3 provided in a liquid crystal display device 1 of Embodiment 1.

Each driving TFT element 7 and a redundancy TFT element 8, which are provided in the signal distribution circuit 3, each include a comb teeth shape electrode (see FIG. 9).

Note that (i) the driving TFT elements 7 and (ii) the redundancy TFT element 8 are designed so as to have respective identical channel widths but are different from each other in electrode shape.

The driving TFT elements 7 are provided so as to be sandwiched between a data signal line driving circuit 6 and the redundancy TFT element 8. A longitudinal direction of the driving TFT elements 7 is orthogonal to a direction in which output terminals of the data signal line driving circuit 6 are provided. A longitudinal direction of the redundancy TFT element 8 is parallel to the direction in which the output terminals of the data signal line driving circuit 6 are provided (see FIG. 9).

With the configuration, it is possible to reduce an area where the signal distribution circuit 3 is formed. Therefore, a picture frame region that is a non-display region can be narrowed in the liquid crystal display device 1.

Figure 10:
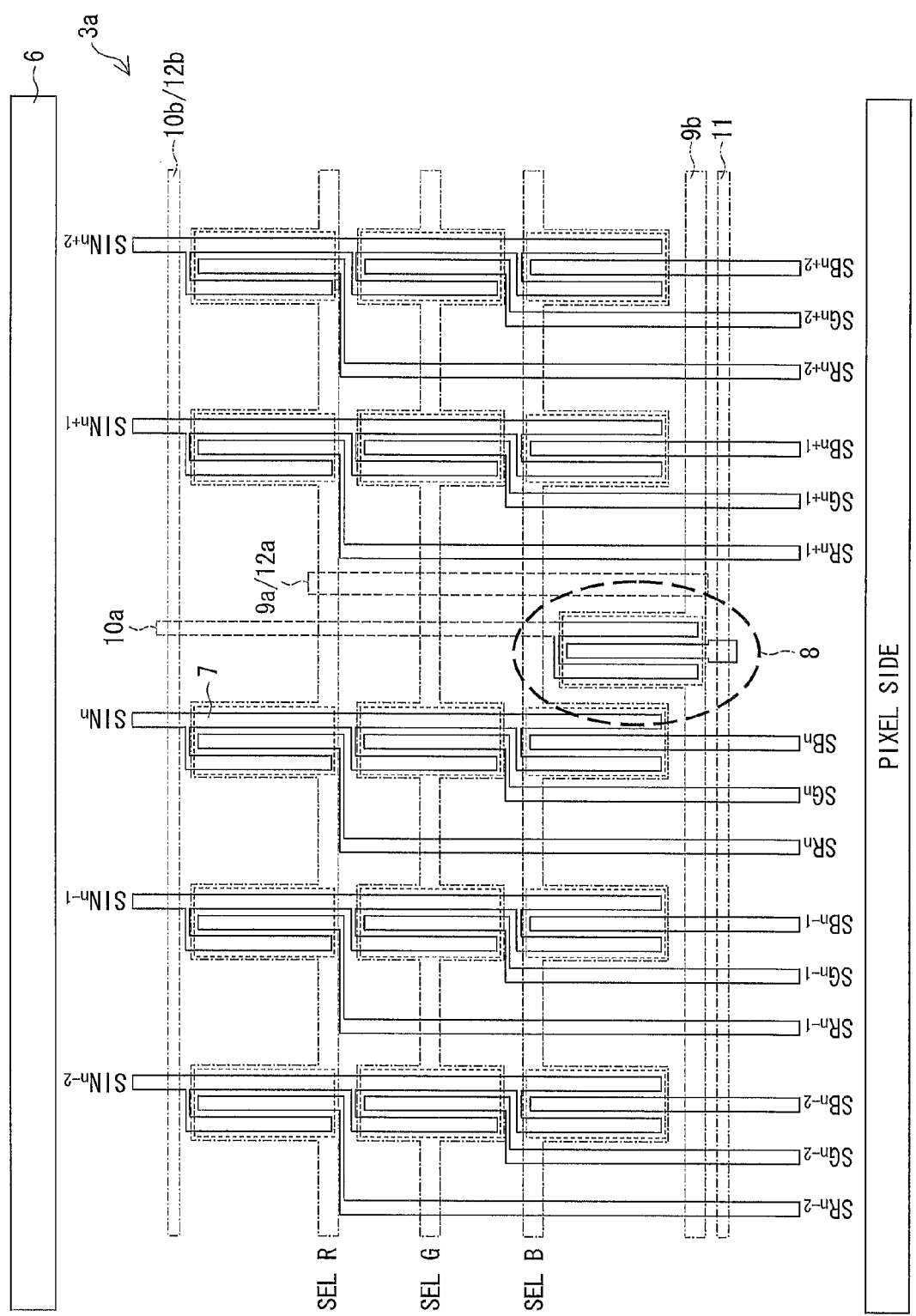
FIG. 10 is a view illustrating a layout of another signal distribution circuit that can be provided in a liquid crystal display device in accordance with an embodiment of the present invention.

FIG. 10 is a view exemplifying a layout of a signal distribution circuit 3a provided in a liquid crystal display device 1 of Embodiment 2 (later described).

Each driving TFT element 7 and a redundancy TFT element 8, which are provided in the signal distribution circuit 3a, each include a comb teeth shape electrode. Note that the redundancy TFT element 8 is provided in a region where the driving TFT elements 7 are provided, unlike the redundancy TFT element 8 illustrated in FIG. 9.

Note that the driving TFT elements 7 and the redundancy TFT element 8, illustrated in FIG. 10, are designed so as to have respective identical channel widths, as with those illustrated in FIG. 9.

With the configuration, it is possible to narrow a picture frame region that is a non-display region in the liquid crystal display device 1. This is because, even in a case where the signal distribution circuit 3a is provided in the liquid crystal display device 1, it is possible to reduce a width in a direction orthogonal to a direction in which output terminals of a data signal line driving circuit 6 are provided, that is, it is possible to reduce a distance between one end of the data signal line driving circuit 6 and one end of a display region.

The following description will discuss a method for restoring a leak (a defect) generated in, for example, a driving TFT element 7 connected to the data signal line SGn+1 illustrated in FIG. 1.

In a case where a leak (a defect) is generated in the driving TFT element 7 connected to the data signal line SGn+1 illustrated in FIG. 1 (not shown), the driving TFT element 7 connected to the data signal line SGn+1 is electrically disconnected at its both ends from the data signal line SGn+1, so as to be electrically isolated from the data signal line SGn+1.

Thereafter, (i) an intersection of a first redundancy line 9a and the second control signal line SEL G and (ii) an intersection of the first redundancy line 9a and a first redundancy line 9b are electrically connected to each other. This allows a control signal, supplied via the second control signal line SEL G, to be supplied to a gate electrode of the redundancy TFT element 8.

Thereafter, (i) an intersection of a second redundancy line 10 connected to the output terminal SINn+1 of the data signal line driving circuit 6 and a fourth redundancy line 12b, and (ii) an intersection of the fourth redundancy line 12b and a second redundancy line 10 connected to the output terminal SINn of the data signal line driving circuit 6, are electrically connected to each other.

Thereafter, the second redundancy line 10 connected to the output terminal SINn of the data signal line driving circuit 6 is electrically disconnected so that output DATA is not supplied from the output terminal SINn of the data signal line driving circuit 6 to a source electrode of the redundancy TFT element 8.

Lastly, a third redundancy line 11 is electrically connected to a drain electrode of the redundancy TFT element 8 and the data signal line SGn+1.

According to the configuration, it is unnecessary to electrically disconnect a leaking part (a defect part) of the driving TFT element 7 by use of laser, unlike a conventional configuration. It is therefore possible to restore the signal distribution circuit 3 in which a leak is generated, by use of the redundancy TFT element 8, the first redundancy lines 9a and 9b, the second redundancy line 10, the redundancy line 11, and the fourth redundancy line 12b, all of which are provided in the signal distribution circuit 3.

[Embodiment 2]

The following description will discuss Embodiment 2 of the present invention with reference to FIGS. 11 through 17. Embodiment 2 is identical to Embodiment 1, (i) except for arrangements of second redundancy lines 10a and 10b and shapes of the second redundancy lines 10a and 10b and (ii) except that the number of redundancy TFT element 8 can be made smaller than the number of output terminals SINn, SINn+1, . . . of a data signal line driving circuit 6 in Embodiment 2. For convenience, identical reference numerals are given to members having respective functions identical to those illustrated in the drawings of Embodiment 1, and their descriptions are omitted in Embodiment 2.

Figure 11:
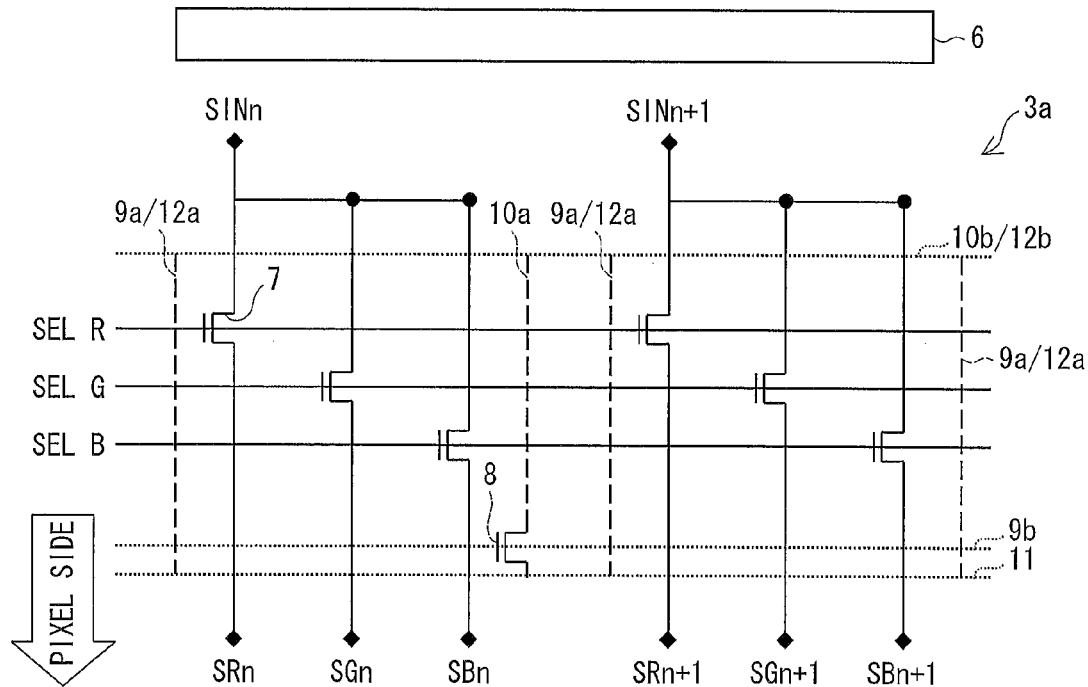
FIG. 11 is a view schematically illustrating a part of a signal distribution circuit provided in a liquid crystal display device in accordance with another embodiment of the present invention.

FIG. 11 is a view schematically illustrating a part of a signal distribution circuit 3a provided in a liquid crystal display device 1 of Embodiment 2.

A second redundancy line 10a is connected to a source electrode of a redundancy TFT element 8, and a second redundancy line 10b is provided in the vicinity of output terminals SINn, SIN+1, . . . of a data signal line driving circuit 6 so as to intersect with the second redundancy line 10a and the output terminals SINn, SIN+1, . . . of the data signal line driving circuit 6 (see FIG. 11).

Figure 12:
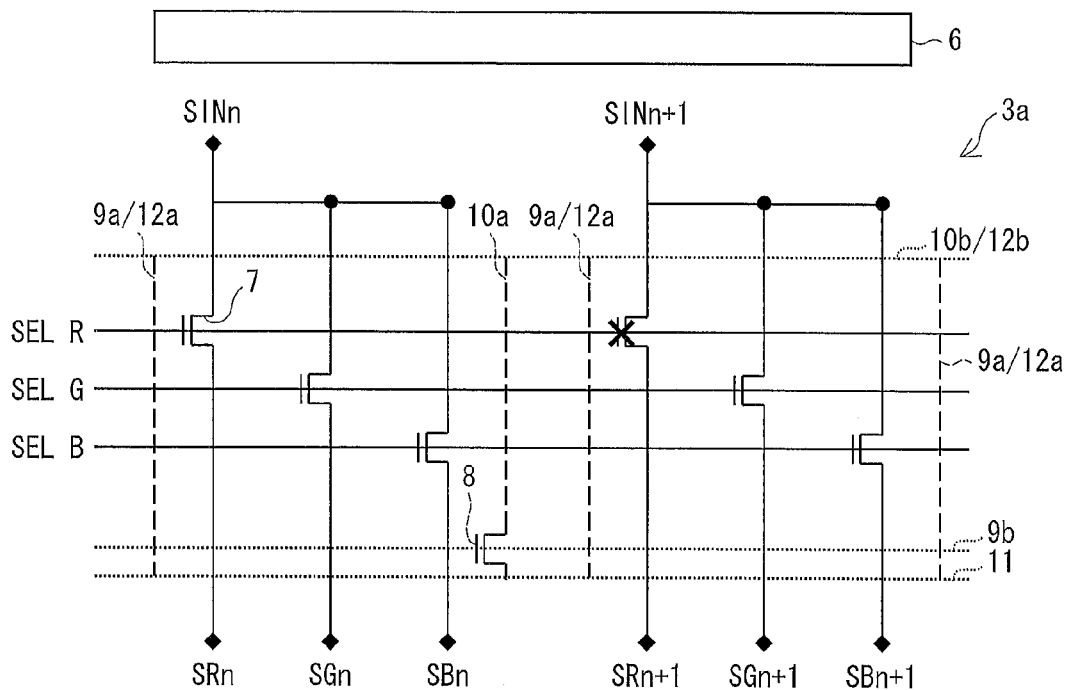
FIG. 12 is a view exemplifying a case where a leak (a defect) is generated in a driving TFT element of a signal distribution circuit provided in a liquid crystal display device in accordance with another embodiment of the present invention.

FIG. 12 is a view exemplifying a case where a leak (a defect) is generated in a driving TFT element 7 of a signal distribution circuit 3 provided in a liquid crystal display device 1 of Embodiment 2.

Specifically, FIG. 12 exemplifies a case where a leak (a defect) is generated in a driving TFT element 7 connected to a data signal line SRn+1.

Figure 13:
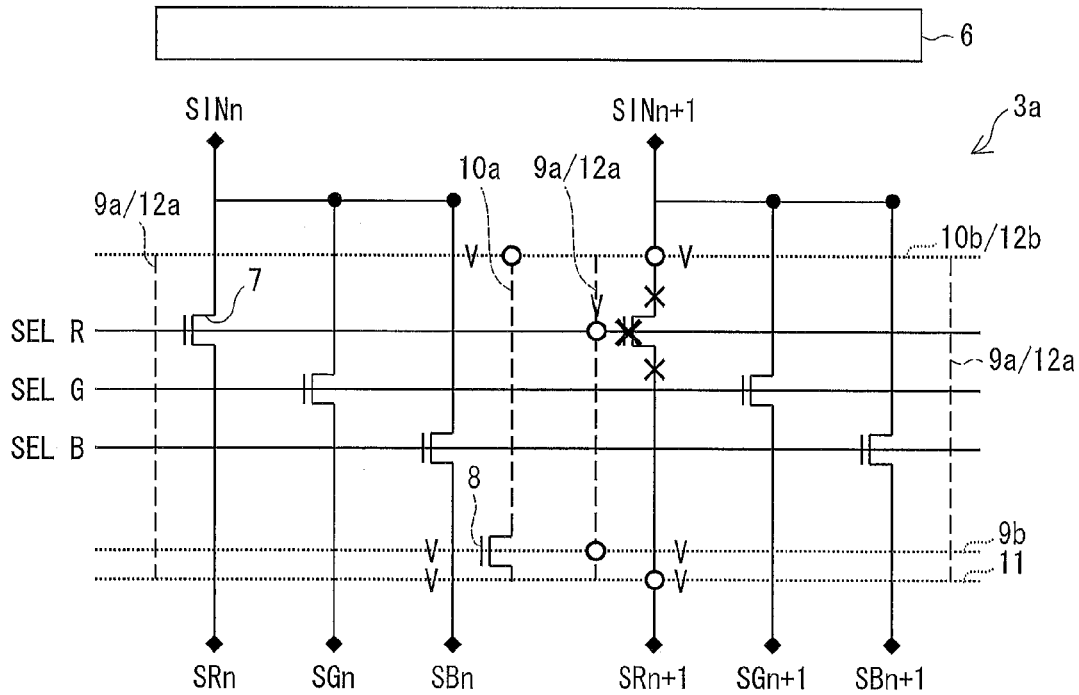
FIG. 13 is an explanatory view for describing a case where the signal distribution circuit illustrated in FIG. 12 is restored by use of a redundancy TFT element, a first redundancy line, a second redundancy line, and a third redundancy line.

FIG. 13 is an explanatory view for describing a case where the signal distribution circuit 3 illustrated in FIG. 12 is restored by use of a redundancy TFT element 8, first redundancy lines 9a and 9b, second redundancy lines 10a and 10b, and a third redundancy line 11.

In FIG. 13, points indicated by circles represent respective parts to be electrically connected by use of laser, points Xs represent respective parts to be electrically disconnected by use of laser, and points Vs represent respective parts to be electrically disconnected by use of laser as appropriate in accordance with a peripheral load (resistor and/or capacitor).

In a case where a leak (a defect) is generated in a driving TFT element 7 connected to a data signal line SRn+1, the driving TFT element 7 connected to the data signal line SRn+1 is electrically disconnected at its both ends from the data signal line SRn+1 so as to be electrically isolated from the data signal line SRn+1 (see FIG. 13).

Thereafter, (i) an intersection of the second redundancy line 10b and an output terminal SINn+1 of the data signal line driving circuit 6 and (ii) an intersection of the second redundancy line 10b and the second redundancy line 10a are electrically connected to each other. This allows output DATA, supplied from the output terminal SINn+1 of the data signal line driving circuit 6, to be supplied to the source electrode of the redundancy TFT element 8.

Thereafter, (i) an intersection of the first redundancy line 9a and a control signal line SEL R and (ii) an intersection of the first redundancy line 9a and the first redundancy line 9b are electrically connected to each other. This allows a control signal, supplied via the control signal line SEL R, to be supplied to a gate electrode of the redundancy TFT element 8.

Thereafter, the third redundancy line 11 is electrically connected to the data signal line SRn+1 at their intersection. This allows output DATA, supplied from a drain electrode of the redundancy TFT element 8, to be supplied to the data signal line SRn+1.

Figure 14:
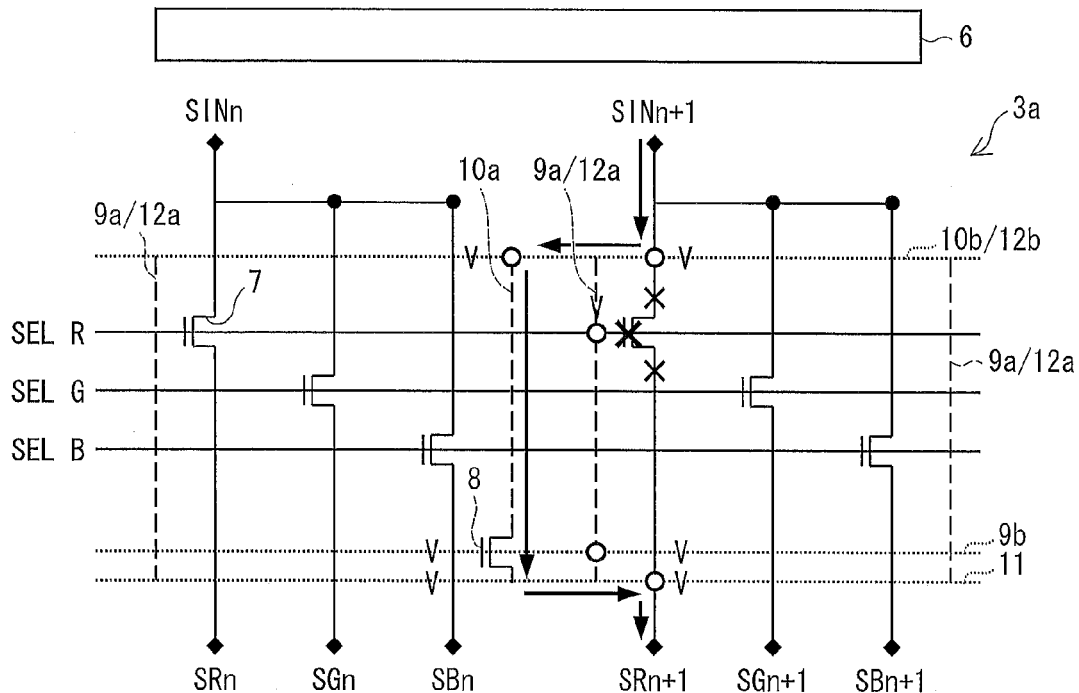
FIG. 14 is a view illustrating how output DATA, outputted from an output terminal of a data signal line driving circuit, flows after the signal distribution circuit is restored as illustrated in FIG. 13.

FIG. 14 is a view illustrating how output DATA, outputted from the output terminal SINn+1 of the data signal line driving circuit 6, flows after the signal distribution circuit 3 is restored as illustrated in FIG. 13.

According to the configuration, the output DATA outputted from the output terminal SINn+1 of the data signal line driving circuit 6 can be supplied to the data signal line SRn+1, via the redundancy TFT element 8 instead of the driving TFT element 7 in which a leak (a defect) is generated (see FIG. 14).

Further, according to the configuration, it is possible to (i) further make the number of redundancy TFT element 8 smaller than the number of output terminals SINn, SINn+1, . . . of the data signal line driving circuit 6, and (ii) narrow a picture frame region that is a non-display region in the liquid crystal display device 1.

Figure 15:
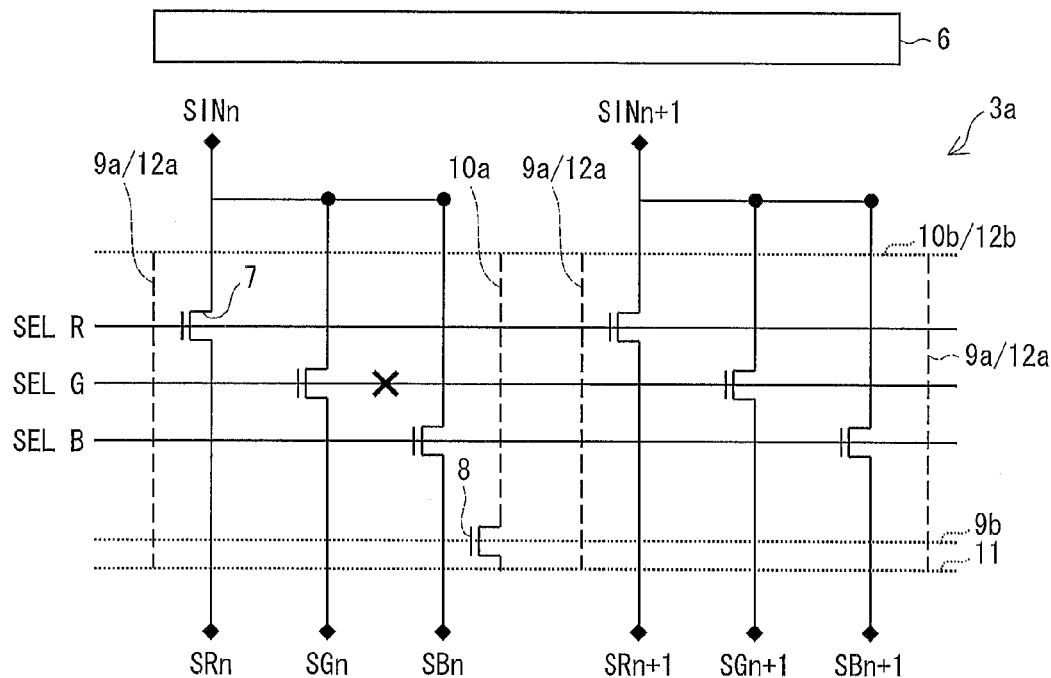
FIG. 15 is a view exemplifying a case where a control signal line SEL G is electrically disconnected in a signal distribution circuit provided in a liquid crystal display device in accordance with another embodiment of the present invention.
Figure 16:
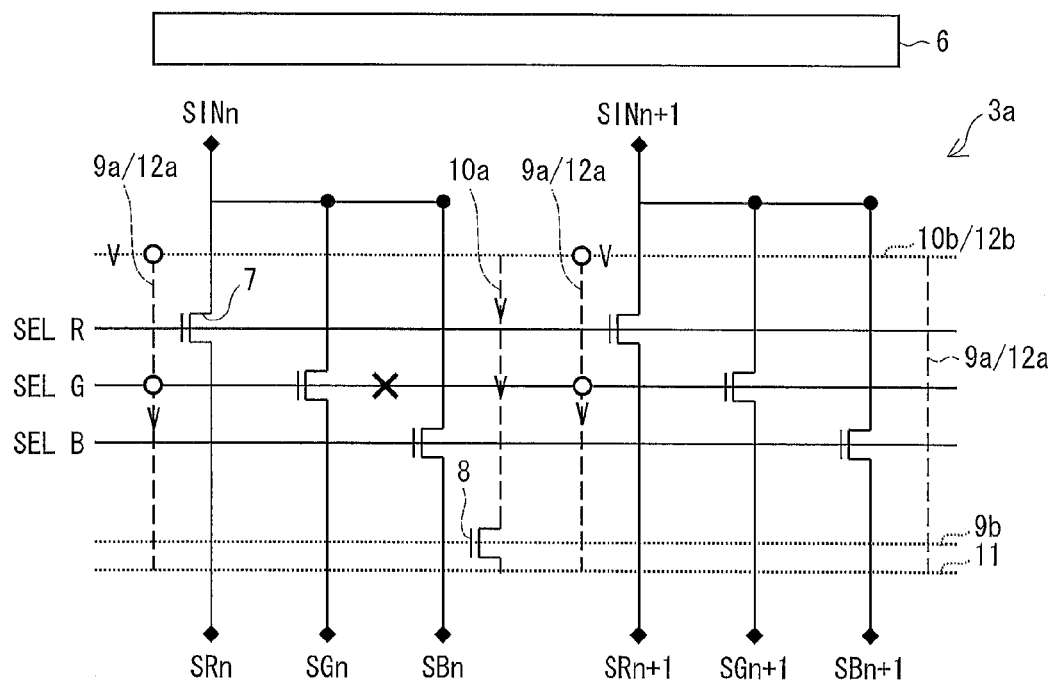
FIG. 16 is an explanatory view for describing a case where an electrical disconnection generated in the signal distribution circuit illustrated in FIG. 15 is restored by use of a fourth redundancy line.
Figure 17:
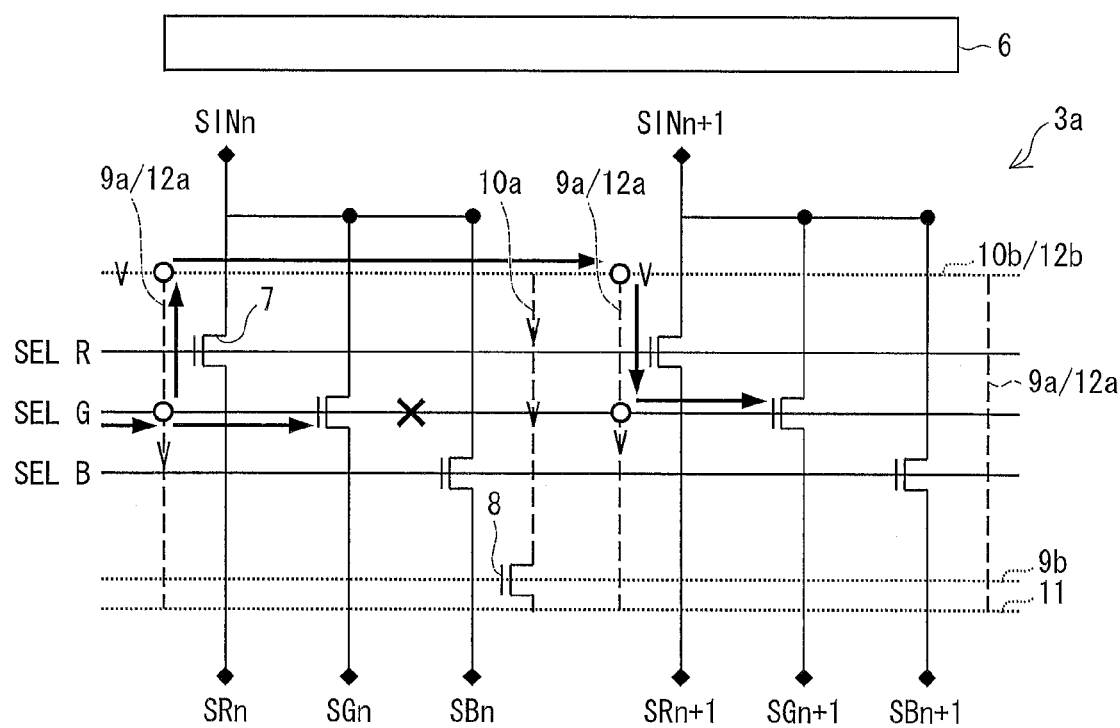
FIG. 17 is a view illustrating how a control signal, supplied via a control signal line SEL G, flows after the signal distribution circuit is restored as illustrated in FIG. 16.
Figure 18:
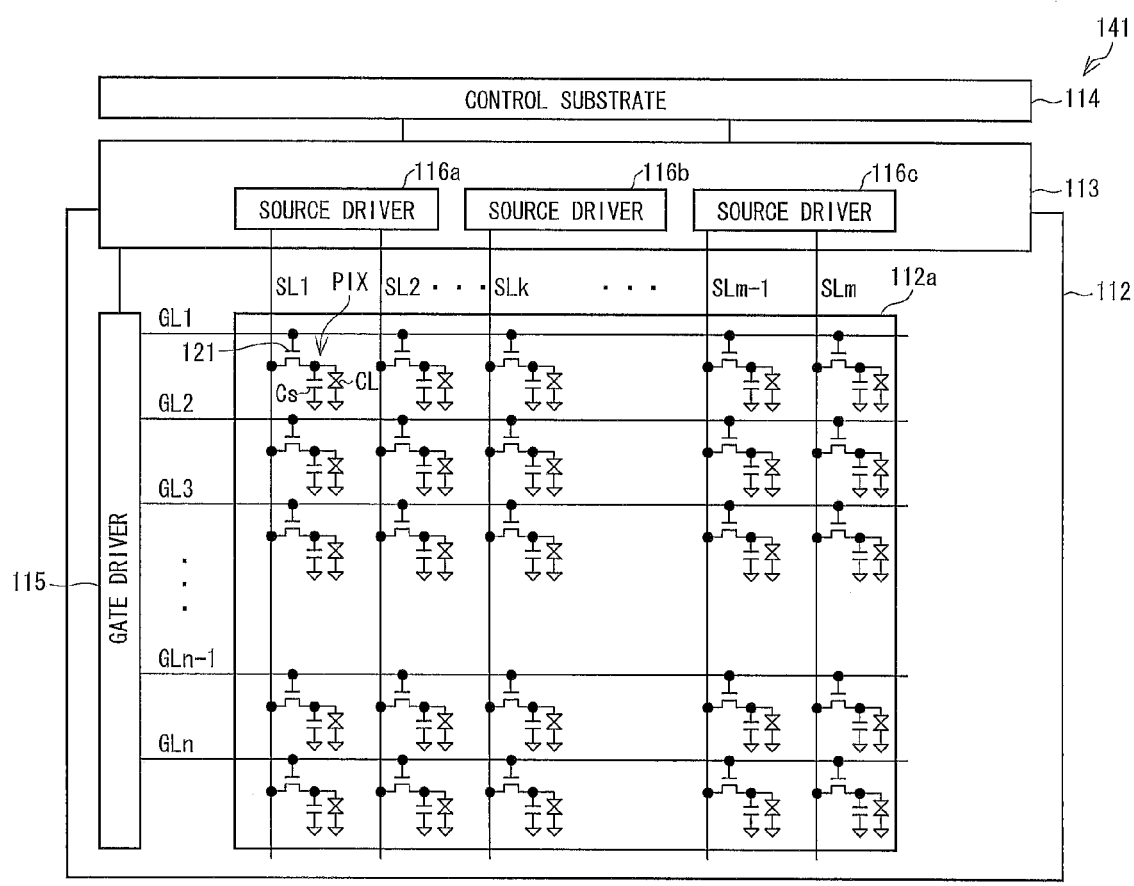
FIG. 18 illustrates a configuration of a conventional liquid crystal display device including a plurality of data signal line driving circuits.

The following description will discuss, with reference to FIGS. 15 through 17, how to restore, by use of the fourth redundancy lines 12a and 12b, an electrical disconnection which has occurred in any of the control signal lines SEL R, SEL G, and SEL B via which different control signals are supplied to gate electrodes of the respective driving TFT elements 7.

Note that, according to Embodiment 2, the fourth redundancy line 12b can be used as a second redundancy line 10b and vice versa so that an area where a signal distribution circuit 3a is formed is reduced. Embodiment 2 is, however, not limited to this. The second redundancy line 10b can be provided separately from the fourth redundancy line 12b.

FIG. 15 is a view exemplifying a case where a control signal line SEL G is electrically disconnected in a signal distribution circuit 3a provided in a liquid crystal display device 1 of Embodiment 2.

FIG. 15 illustrates an electrical disconnection generated in the control signal line SEL G between first and second driving TFT elements 7 each of which is connected to the control signal line SEL G.

FIG. 16 is an explanatory view for describing a case where the electrical disconnection generated in the signal distribution circuit 3a illustrated in FIG. 15 is restored by use of the fourth redundancy lines 12a and 12b.

In FIG. 16, points indicated by circles represent respective parts to be electrically connected by use of laser, and points Vs represent respective parts to be electrically disconnected by use of laser as appropriate in accordance with a peripheral load (resistor and/or capacitor).

The fourth redundancy lines 12a each are provided so as to intersect with the control signal lines SEL R, SEL G, and SEL B, and the fourth redundancy line 12b. The fourth redundancy line 12b is provided so as to intersect with the fourth redundancy lines 12a (see FIG. 16).

As illustrated in FIG. 16, (i) an intersection of the fourth redundancy lines 12a and the control signal line SEL G and (ii) an intersection of the fourth redundancy lines 12a and the fourth redundancy line 12b are electrically connected to each other. This allows a control signal, supplied to the control signal line SEL G via the fourth redundancy lines 12a and the fourth redundancy line 12b, to be supplied to a gate electrode of a driving TFT element 7 connected to a data signal line SGn+1.

FIG. 17 is a view illustrating how a control signal, supplied via the control signal line SEL G, flows after the signal distribution circuit 3a is restored as illustrated in FIG. 16.

According to the configuration, a control signal supplied to the first driving TFT element 7 is supplied to the second driving TFT element 7 connected to the control signal line SEL G, via the fourth redundancy lines 12a and the fourth redundancy line 12b, instead of using a part of the control signal line SEL G, in which part the electrical disconnection is generated (see FIG. 17).

The signal distribution circuit 3a can be configured to include three sets (three) for the respective control signal lines SEL R, SEL G, and SEL B, each of which sets is made up of (i) the redundancy TFT element 8, (ii) a first redundancy line for supplying a corresponding control signal to a gate electrode of the redundancy TFT element 8, (iii) a second redundancy line for supplying output DATA to a source electrode of the redundancy TFT element 8 from a corresponding output terminal of the data signal line driving circuit 6, and (iv) a third redundancy line for supplying output DATA to a corresponding data signal line from a drain electrode of the redundancy TFT element 8 (the configuration is not shown).

According to the configuration, it is possible to reduce a restoration time during production.

It is preferable to configure the display device of the present invention such that the driving circuit further includes a fourth redundancy line, and the fourth redundancy line is electrically connected, at a plurality of places between which there is a predetermined distance, to the one of the plurality of first lines, so that a corresponding one of the different first signals, that is to be supplied via the one of the plurality of first lines, is supplied, via the fourth redundancy line, to the one of the plurality of first lines.

According to the configuration, in a case where a defect part is generated in any of the plurality of first lines for supplying different first signals to the gate electrodes of the respective driving TFT elements, restoration is carried out by use of the fourth redundancy line.

It is preferable to configure the display device of the present invention such that the driving circuit is a signal distribution circuit including (i) a plurality of branch lines into which each output terminal of a data signal line driving circuit for supplying an image signal to be displayed in the display region is branched, (ii) the driving TFT elements provided for the respective plurality of lines, and (iii) control signal lines for supplying control signals to the gate electrodes of the respective driving TFT elements so as to drive the driving TFT elements electrically connected to the respective plurality of branch lines such that the respective driving TFT elements are turned on in a time-shared manner during a horizontal period.

According to the configuration, it is possible to provide a display device employing a signal distribution circuit (an SSD circuit) including driving TFT elements each having a wide channel width, in which signal distribution circuit even in a case where a leaking part (a defect part) is generated in any of the plurality of first lines for supplying different first signals to the gate electrodes of the respective driving TFT elements, it does not take long to restore the leaking part, and productivity can be improved, the driving TFTs elements keeping the respective channel widths identical to one another even after the leaking part is restored.

It is preferable to configure the display device of the present invention such that the each output terminal of the data signal line driving circuit is branched into a first line, a second line, and a third line, the first line, the second line, and the third line are connected to first, second, and third driving TFT elements, respectively, the first through third driving TFT elements have first through third gate electrodes connected to a first control signal line, a second control signal line, and a third control signal line for supplying first through third control signals to the first through third gate electrodes, respectively, and the signal distribution circuit includes three sets for the respective first through third control signal lines, each of which sets is made up of the redundancy TFT element, the first redundancy line, the second redundancy line, and the third redundancy line.

According to the configuration, the three sets are provided for the respective first through third control signal lines, each of which sets is made up of the redundancy TFT element, the first redundancy line, the second redundancy line, and the third redundancy line. For example, in a case where a defect part is generated in a driving TFT element electrically connected to the first control signal line or the first control signal line, restoration can be carried out by use of the set, for the first control signal line, of the redundancy TFT element, the first redundancy line, the second redundancy line, and the third redundancy line.

It is therefore possible to shorten a restoration time during production.

It is preferable to configure the display device of the present invention such that the driving TFT elements are provided so as to be sandwiched between the data signal line driving circuit and the redundancy TFT element, a longitudinal direction of the driving TFT elements is orthogonal to a direction in which the output terminals of the data signal line driving circuit are aligned, and a longitudinal direction of the redundancy TFT element is parallel to the direction in which the output terminals of the data signal line driving circuit are aligned.

It is preferable to configure the display device of the present invention such that the driving TFT elements are provided so as to be sandwiched between the data signal line driving circuit and the display region, a longitudinal direction of the driving TFT elements and a longitudinal direction of the redundancy TFT element are orthogonal to a direction in which the output terminals of the data signal line driving circuit are aligned, and the redundancy TFT element is provided so as to be sandwiched between driving TFT elements.

According to the configuration, it is possible to reduce an area where the signal distribution circuit (SSD circuit) is formed. Therefore, a picture frame region that is a non-display region can be narrowed in the display device.

It is preferable to configure the display device of the present invention such that the semiconductor layers of the driving TFT elements and semiconductor layers of the pixel TFT elements are each made from amorphous silicon.

According to the configuration, it is possible to prevent increase in unit cost for manufacturing the display device.

It is preferable to configure the display device of the present invention such that the semiconductor layers of the driving TFT elements and semiconductor layers of the pixel TFT elements are each made from an oxide.

The semiconductor layers can be made from, for example, an amorphous oxide containing at least one element selected from the group consisting of In, Ga and Zn. Note, however, that a material for the semiconductor layers is not limited to the amorphous oxide.

It is preferable to configure the display device of the present invention such that the semiconductor layers of the driving TFT elements and semiconductor layers of the pixel TFT elements are each made from microcrystalline silicon.

It is preferable to configure the display device of the present invention such that the semiconductor layers of the driving TFT elements and semiconductor layers of the pixel TFT elements are each layer stack in which a microcrystalline silicon layer and an amorphous silicon layer are stacked.

According to the configuration, the semiconductor layers of the driving TFT elements are made from microcrystalline silicon, or the layer stack in which a microcrystalline silicon layer and an amorphous silicon layer are stacked. It is therefore possible to produce the display device at a relatively lower cost.

It is preferable to configure the display device of the present invention such that the semiconductor layers of the driving TFT elements and semiconductor layers of the pixel TFT elements are each made from polycrystalline silicon.

It is preferable to configure the display device of the present invention such that the semiconductor layers of the driving TFT elements and semiconductor layers of the pixel TFT elements are each made from continuous grain boundary crystal silicon.

According to the configuration, the semiconductor layers of the driving TFT elements are made from polycrystalline silicon or continuous grain boundary crystal silicon. It is therefore possible to form not only a scanning signal line driving circuit and the signal distribution circuit (SSD circuit) but also the data signal line driving circuit monolithically with the pixel TFT elements. Hence, a display device, with a high reliability, in which a picture frame region that is a non-display region is narrowed, can be provided.

The present invention is not limited to the description of the embodiments above, and can therefore be modified by a skilled person in the art within the scope of the claims. Namely, an embodiment derived from a proper combination of technical means disclosed in different embodiments is encompassed in the technical scope of the present invention.

INDUSTRIAL APPLICABILITY

The present invention is applicable to a device such as a semiconductor device or a display device.

REFERENCE SIGNS LIST

1: liquid crystal display device (display device)
3 and 3a: signal distribution circuit (driving circuit)
4: scanning signal line driving circuit (driving circuit)
6: data signal line driving circuit (driving circuit)
7: driving TFT element
8: redundancy TFT element
9a and 9b: first redundancy line
10a and 10b: second redundancy line
11: third redundancy line
12a and 12b: fourth redundancy line
SEL R, SEL G, and SEL B: control signal line
R1: display region

The invention claimed is:

1. A display device, having:
a display region where (i) pixels arranged in a matrix manner and (ii) pixel TFT elements provided for the respective pixels, are provided; and
a region on the periphery of the display region, in which region a driving circuit, including driving TFT elements formed monolithically with the pixel TFT elements, is provided,
each of the driving TFT elements including a semiconductor layer, a gate electrode, a source electrode, and a drain electrode,
the gate electrode being provided on a first surface of the semiconductor layer, and the source electrode and the drain electrode being provided on a second surface of the semiconductor layer, the second surface facing the first surface,
one of the source electrode and the drain electrode being provided, in a region, so as to surround part of the other of the source electrode and the drain electrode,
the one of the source electrode and the drain electrode being away, in the region, from the other by a constant distance,
the driving circuit further including (i) a redundancy TFT element provided so as to have a channel width identical to those of the driving TFT elements, (ii) a first redundancy line, (iii) a second redundancy line, and (iv) a third redundancy line,
the first redundancy line being provided, by electrically connecting to one of a plurality of first lines for supplying different first signals to the gate electrodes of the respective driving TFT elements, so as to supply, to a gate electrode of the redundancy TFT element, a first signal that is to be supplied via the one of the plurality of first lines electrically connected to the first redundancy line,
the second redundancy line being provided, by electrically connecting to one of a plurality of second lines for supplying different second signals to the source electrodes of the respective driving TFT elements, so as to supply, to a source electrode of the redundancy TFT element, a second signal that is to be supplied via the one of the plurality of second lines electrically connected to the second redundancy line, and
the third redundancy line being electrically connected to a drain electrode of the redundancy TFT element, and the third redundancy line being provided, by electrically connecting to one of a plurality of third lines, via which the different second signals are outputted from the drain electrodes of the respective driving TFT elements, so that a corresponding one of the different second signals, which is to be outputted from the drain electrode of the redundancy TFT element, is outputted from the one of the plurality of third lines electrically connected to the third redundancy line.

2. The display device as set forth in claim 1, wherein:
the driving circuit further includes a fourth redundancy line, and
the fourth redundancy line is electrically connected, at a plurality of places between which there is a predetermined distance, to the one of the plurality of first lines, so that a corresponding one of the different first signals, that is to be supplied via the one of the plurality of first lines, is supplied, via the fourth redundancy line, to the one of the plurality of first lines.

3. The display device as set forth in claim 1, wherein:
the driving circuit is a signal distribution circuit including (i) a plurality of branch lines into which each output terminal of a data signal line driving circuit for supplying an image signal to be displayed in the display region is branched, (ii) the driving TFT elements provided for the respective plurality of lines, and (iii) control signal lines for supplying control signals to the gate electrodes of the respective driving TFT elements so as to drive the driving TFT elements electrically connected to the respective plurality of branch lines such that the respective driving TFT elements are turned on in a time-shared manner during a horizontal period.

4. The display device as set forth in claim 3, wherein:
the each output terminal of the data signal line driving circuit is branched into a first line, a second line, and a third line,
the first line, the second line, and the third line are connected to first, second, and third driving TFT elements, respectively,
the first through third driving TFT elements have first through third gate electrodes connected to a first control signal line, a second control signal line, and a third control signal line for supplying first through third control signals to the first through third gate electrodes, respectively, and
the signal distribution circuit includes three sets for the respective first through third control signal lines, each of which sets is made up of the redundancy TFT element, the first redundancy line, the second redundancy line, and the third redundancy line.

5. The display device as set forth in claim 3, wherein:
the driving TFT elements are provided so as to be sandwiched between the data signal line driving circuit and the redundancy TFT element,
a longitudinal direction of the driving TFT elements is orthogonal to a direction in which the output terminals of the data signal line driving circuit are aligned, and
a longitudinal direction of the redundancy TFT element is parallel to the direction in which the output terminals of the data signal line driving circuit are aligned.

6. The display device as set forth in claim 3, wherein:
the driving TFT elements are provided so as to be sandwiched between the data signal line driving circuit and the display region,
a longitudinal direction of the driving TFT elements and a longitudinal direction of the redundancy TFT element are orthogonal to a direction in which the output terminals of the data signal line driving circuit are aligned, and
the redundancy TFT element is provided so as to be sandwiched between driving TFT elements.

7. The display device as set forth in claim 1, wherein:
the semiconductor layers of the driving TFT elements and semiconductor layers of the pixel TFT elements are each made from amorphous silicon.

8. The display device as set forth in claim 1, wherein:
the semiconductor layers of the driving TFT elements and semiconductor layers of the pixel TFT elements are each made from an oxide.

9. The display device as set forth in claim 1, wherein:
the semiconductor layers of the driving TFT elements and semiconductor layers of the pixel TFT elements are each made from microcrystalline silicon.

10. The display device as set forth in claim 1, wherein:
the semiconductor layers of the driving TFT elements and semiconductor layers of the pixel TFT elements are each made from polycrystalline silicon.

11. The display device as set forth in any claim 1, wherein:
the semiconductor layers of the driving TFT elements and semiconductor layers of the pixel TFT elements are each made from continuous grain boundary crystal silicon.

12. The display device as set forth in claim 1, wherein:
the semiconductor layers of the driving TFT elements and semiconductor layers of the pixel TFT elements are each layer stack in which a microcrystalline silicon layer and an amorphous silicon layer are stacked.

* * * * *